United States Patent
Miro Panades

(10) Patent No.: US 9,823,301 B2
(45) Date of Patent: Nov. 21, 2017

(54) METHOD FOR CHARACTERIZING THE OPERATION OF A DIGITAL ELECTRONIC CIRCUIT AND DIGITAL ELECTRONIC CIRCUIT

(71) Applicant: COMMISSARIAT A L'ENERGIE ATOMIQUE ET AUX ENERGIES ALTERNATIVES, Paris (FR)

(72) Inventor: Ivan Miro Panades, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/117,017

(22) PCT Filed: Feb. 9, 2015

(86) PCT No.: PCT/EP2015/052614
§ 371 (c)(1),
(2) Date: Aug. 5, 2016

(87) PCT Pub. No.: WO2015/118145
PCT Pub. Date: Aug. 13, 2015

(65) Prior Publication Data
US 2016/0349316 A1     Dec. 1, 2016

(30) Foreign Application Priority Data

Feb. 7, 2014   (FR) ...................................... 14 50980
Feb. 7, 2014   (FR) ...................................... 14 50981

(51) Int. Cl.
*G01R 31/30*    (2006.01)
*G01R 31/317*   (2006.01)
(Continued)

(52) U.S. Cl.
CPC ... *G01R 31/3016* (2013.01); *G01R 31/31725* (2013.01); *H03K 5/13* (2013.01); *H03K 2005/00013* (2013.01)

(58) Field of Classification Search
CPC .................................................. G01R 31/3016
See application file for complete search history.

(56) References Cited

U.S. PATENT DOCUMENTS 7,969,216 B2 *   6/2011   Dennis ...................... G06F 1/10
                                                         327/161
9,106,233 B1 *   8/2015   Rosen ...................... H03L 7/00
(Continued)

FOREIGN PATENT DOCUMENTS

WO    WO 2010/122036 A1    10/2010

OTHER PUBLICATIONS

International Search Report as issued in International Patent Application No. PCT/EP2015/052614, dated Apr. 23, 2015.
(Continued)

*Primary Examiner* — Hai L Nguyen
(74) *Attorney, Agent, or Firm* — Pillsbury Winthrop Shaw Pittman LLP

(57)    ABSTRACT

A method is presented for characterizing a digital circuit for determining an optimum operating point of the digital circuit. The digital circuit includes sequential elements; conducting data paths; a clock tree; a time fault sensor receiving as input a data signal and configured to detect during a detection window a transition of the data signal; and a system for setting first and second operating parameters of the circuit. The method includes a) activating a conducting data path leading to the sequential element coupled to the sensor; b) determining, for a given value of the first parameter, a first value of the second parameter from which the sensor detects a transition of the data signal during the
(Continued)

detection window, the values of the first and second parameters defining an operating point of the circuit; and c) correcting the operating point.

23 Claims, 8 Drawing Sheets

(51) Int. Cl.
*H03K 5/13* (2014.01)
*H03K 5/00* (2006.01)

(56) References Cited

U.S. PATENT DOCUMENTS

2008/0104561 A1  5/2008  Carpenter et al.
2010/0153896 A1  6/2010  Sewall et al.

OTHER PUBLICATIONS

Kunitake, Y., et al., "Possibilities to Miss Predicting Timing Errors in Canary Flip-flops," Circuits and Systems (MWSCAS), 2011 IEEE 54$^{th}$ International Midwest Symposium, Aug. 7, 2011, XP031941599, pp. 1-4.

Beigne, E., et al., "A Fine Grain Variation-Aware Dynamic Vdd-Hopping AVFS Architecture on a 32nm GALS MPSoC," 2013 Proceedings of the ESSCIRC (ESSCIRC), IEEE, Sep. 16, 2013, XP032518996, pp. 57-60.

Burd, T D., et al., "A Dynamic Voltage Scaled Microprocessor System," IEEE Journal of Solid-State Circuits, vol. 35, No. 11, Nov. 2000, pp. 1571-1580.

International Preliminary Report on Patentability and the Written Opinion of the International Searching Authority as issued in International Patent Application No. PCT/EP2015/052614, dated Aug. 9, 2016.

* cited by examiner

METHOD FOR CHARACTERIZING THE OPERATION OF A DIGITAL ELECTRONIC CIRCUIT AND DIGITAL ELECTRONIC CIRCUIT

CROSS-REFERENCE TO RELATED APPLICATIONS

This is the U.S. National Stage of PCT/EP2015/052614, filed Feb. 9, 2015, which in turn claims priority to French Patent Application No. 1450981, filed Feb. 7, 2014 and French Patent Application No. 1450980, filed Feb. 7, 2014, the entire contents of all applications are incorporated herein by reference in their entireties.

TECHNICAL FIELD

The present invention pertains to the optimisation of the operation of a digital electronic circuit, in terms of energy consumption or operating speed. More particularly, the invention relates to a characterization method, capable of determining the optimum operating conditions of the circuit, and to a circuit of which the operation is optimised.

STATE OF THE ART

Digital electronic circuits use a clock, generating a clock signal at a predetermined frequency, called clock frequency, for setting the rhythm of data transfers between sequential elements, for example of flip-flop type. In order to improve the performances of digital circuits, it may be sought to use the highest possible clock frequency. It may also be sought to reduce the supply voltage of the circuit, in order to reduce its energy consumption.

In digital electronic circuits, a certain number of verifications, called time verifications, have to be carried out to ensure that the circuit remains functional at the recommended clock frequency and supply voltage. These verifications are conventionally carried out by the calculation of the propagation times on the data and clock paths of the circuit, while ensuring that the constraints of hold and set-up times of flip-flops are not violated—these are known as time violations. The set-up time of a flip-flop corresponds to the minimum stability time that a data has to respect as input of the flip-flop before the clock edge arrives, in order that the data is effectively taken into account by the flip-flop. The hold time of a flip-flop corresponds to the minimum stability time that a data must respect at the input of the flip-flop after the clock edge has arrived, in order that it is correctly sampled by the flip-flop.

Worst-case type analyses make it possible to identify the critical paths limiting the operating frequency of the circuit and to estimate in a realistic manner the propagation times in these paths. The critical paths correspond in practice to the paths capable of being taken by a data signal and for which the risks of time violations are the most probable. The maximum clock frequency is then determined by the propagation times of the critical paths, to which a time margin is added.

The time margin is defined as the difference between the expected arrival time of the data signal at the input of the flip-flop and the arrival time inducing a violation of the time constraint (set-up time and/or hold time). This safety margin is required because the data propagation times are not constant, due notably to variations in the manufacturing process (i.e. variation from one circuit to another) and environmental variations (variation during the operation of the circuit). Environmental variations are, for example, local and temporary drops in the supply voltage or instead temperature gradients.

Time margins taken during worst-case analyses have become very pessimistic, because all these variations necessitate the taking into account of greater and greater time margins to be certain of covering all eventualities. The digital circuit thus cannot be optimised in an efficient manner, when these conventional analysis methods are applied.

Propagation time drifts, due to difficult to predict dynamic variations in temperature and supply voltage, make the on-line monitoring of the performances of the circuit indispensable, in order to detect these drifts and to find the optimum operating point of the circuit by reducing as best as possible the time margins.

The document ["Possibilities to Miss Predicting Timing Errors in Canary Flip-flops" Y. Kunitake et al., Institute of Electrical and Electronics Engineers; Jan. 7, 2011] proposes two solutions for carrying out on-line monitoring of performances called "Dynamic Voltage Scaling". These solutions consist in integrating in the very functionality of the circuit a device for detecting time violations and commanding a variation in the supply voltage (or the operating frequency: "Dynamic Frequency Scaling") depending on the occurrence of these time violations.

The detection devices proposed are coupled to a sequential element of flip-flop type and aim to determine whether a data signal at the input of the flip-flop is stable, by comparing the value of this signal between two instants. If the data is not stable, there are strong chances that the hold and set-up times of the flip-flop are violated. To sample the data signal at two instants, a redundancy at the level of the flip-flop is implemented.

FIG. 1 represents a first detection device 100, called "Razor" device and arranged in a data path between two stages of the digital circuit, an upstream stage and a downstream stage (not represented). A first flip-flop 101, known as "main" flip-flop, samples a data signal D in a conventional manner at the active edge of a clock signal CLK, whereas a second tracking flip-flop 102 samples the same signal D at the active edge of a delayed clock signal CLK-d. The clock CLK-d is delayed with respect to the clock CLK such that the flip-flop 102 samples the data after the active edge of the signal CLK. Then, with the help of a comparator 103 connected to the outputs of the flip-flops 101 and 102, the value contained in the flip-flop 101 is compared with that of the flip-flop 102.

If the two values are identical, it is considered that the data signal D was stable at the active edge of the clock signal CLK and that, consequently, the data has been correctly sampled by the main flip-flop 101. If conversely the two values differ, this means that there is a transition of the data signal D between the two instants and thus the data captured by the flip-flop 101 risks not being exact. The output of the comparator 103 supplies an alert signal, which indicates in this case that a time fault has occurred.

The "Razor" device comprises a catch-up module 104 configured, when a fault has been detected, to restore the correct value of the data signal D in the main flip-flop 101, from that sampled by the tracking flip-flop 102 (which is, by hypothesis, always correct). The catch-up module 104 makes it possible to re-execute the operation at a lower frequency or a higher voltage than the sequence at fault.

In order that this device detects a fault, the value of the data signal D must not be modified immediately after the active edge of the clock signal CLK—in other words, it is wished to be certain that the flip-flop 102 "sees" the correct value of the data signal D to then compare it. The data signal D must thus be maintained at the least up to the instant where the flip-flop 102 samples the signal D. This necessitates adding to the shortest paths leading to the main flip-flop 101 one or more delay cells—called buffers—which slow down the propagation of the data signal D when the signal takes these shorter paths.

A second device for detecting time violations, called "Canary Flip-Flop" in the aforementioned article, applies a similar technique to the "Razor" device, in that it compares two values of the data signal, taken at different instants by doubling the sequential elements of flip-flop type. Nevertheless, rather than detecting the error, this system makes it possible to anticipate it, by observing the status of the data signal before the active edge of the clock, and not after. The need for a catch-up module is thus avoided.

FIG. 2 schematically represents a detection device 200 of "Canary Flip-Flop" type. The two flip-flops 101 and 102 are here clocked by the same clock signal CLK. Thanks to a delay cell 201 situated at the input of the tracking flip-flop 102 and which delays the data signal D, the flip-flop 102 samples a value of the signal D occurring before the value sampled by the main flip-flop 101 in the clock cycle. If the two values at the output of the flip-flops 101 and 102 are identical, this means that the data was stable before the active edge of the clock signal. The data sampled by the main flip-flop 101 may then be considered as correct. Conversely, if the values differ, this means that the data signal D was not yet stabilised and the data sampled cannot be the correct one.

In one or the other of these solutions, it is not guaranteed that, between the two detection instants, the data signal D has not changed value on two occasions. This would signify that the data signal D is not stable. For all that, no fault would be detected.

In order to improve detection reliability, stability sensors have been proposed, which observe transitions of the data signal throughout a whole time period—called detection window—and not uniquely by comparison of values between two instants. The detection window may be placed before, around or after the rising edge, depending on whether it is wished to detect a violation of the set-up time or the hold time. Such a monitoring device is notably described in the application WO2010/122036.

All of the aforementioned stability sensors ("Razor", "Canary Flip-Flop" and monitoring devices) are in general coupled to the data paths that are the most critical in a digital circuit, that is to say the paths in which the propagation time of the data signal is the longest, in order to minimise the safety margin and operate the circuit at a frequency close to the maximum frequency of the circuit. Consequently, in order that these sensors detect a time fault, it is necessary that these critical paths are activated, that is to say that a data signal travels along these paths. Yet, these critical paths are only activated very rarely.

The problem is then the following: as long as these critical paths are not activated, no faults are detected and it may be believed that the circuit can operate at a higher clock frequency or at a lower supply voltage. Increasing the frequency or reducing the voltage will have the consequence of further lengthening the propagation delays, with respect to the active edge of the clock signal. It may then happen that these sensors do not see a transition of the data signal, because said transition takes place well after the detection window. In other words, the sensors will have become blind to the time violations taking place on the critical paths, when these paths are, when their turn comes, taken by the data signal.

This problem of detection may be resolved uniquely in the case of the "Razor" system by widening the detection window, which implies introducing numerous buffer cells. The circuit then occupies more surface area and consumes more energy.

Consequently, none of the solutions proposed until now make it possible to optimise as best as possible the digital circuit from an energy viewpoint, by minimising the safety margins taken to avoid time violations, while guaranteeing that no time violation occurs.

SUMMARY OF THE INVENTION

The invention aims to optimise the operation of a digital electronic circuit, by determining an operating point which respects the time constraints with the minimum safety margin and whatever its environment.

According to the invention, this need tends to be satisfied by providing a method for characterizing an integrated circuit consisting in determining at a given instant of the life of the circuit an optimum operating point of the digital circuit comprising:
- a plurality of sequential elements;
- data conducting paths between the sequential elements;
- a clock tree delivering a clock signal for clocking the sequential elements; and
- a time fault sensor of preventive type coupled to one of the sequential elements, receiving as input a data signal arriving at the sequential element and configured to detect, during a detection window, a transition of the data signal,
- means for setting at least one first and one second operating parameters of the digital circuit.

This characterization method comprises the following steps:
e) activating a data conducting path up to the sequential element coupled to the sensor;
f) determining, for a given value of the first parameter, a first value of the second parameter from which the sensor detects a transition of the data signal during the detection window, said values of the first and second parameters defining a detection operating point of the digital circuit;
g) determining the optimum operating point associated with the detection operating point, by adding to the first value of the second parameter a predetermined correction margin in relation with a limit value of the second parameter which would lead to a malfunction of the digital circuit for the given value of the first parameter, said correction margin being associated with the given value of the first parameter of the detection operating point.

Preferably, the predetermined correction margin is memorised in a memory of the circuit or is calculated from a functional relation memorised in the circuit; the memorised values or functional relation being obtained by the implementation of a calibration method described below.

Steps e) to g) are advantageously carried out for several values of the first parameter.

In a preferential embodiment of the characterization method, the circuit comprises a plurality of time fault sensors of preventive type each coupled to one of the sequential elements, and steps e) to g) are carried out for each sensor, so as to obtain a plurality of corrected operating points having the same value of the first parameter, the method further comprising a step of determining, from the plurality of corrected operating points, a single optimum operating point associated with the considered value of the first parameter.

According to a development of the characterization method, the single optimum operating point is defined by said value of the first parameter and an arithmetic mean of said values of the second parameter of the plurality of corrected operating points.

According to another development of the characterization method, the second parameter is the frequency of the clock signal and the single optimum operating point is defined by said value of the first parameter and the lowest of said values of the second parameter of the plurality of corrected operating points.

According to another development of the characterization method, the second parameter is the supply voltage of the digital circuit and the single optimum operating point is defined by said value of the first parameter and the highest of said values of the second parameter of the plurality of corrected operating points.

Another aspect of the invention relates to a calibration method making it possible to determine the correction margin. This calibration method comprises the following steps:
a) activating a data conducting path up to the sequential element coupled to the sensor;
b) determining, for a given value of the first parameter, a first value of the second parameter from which the sensor detects a transition of the data signal during the detection window, said values of the first and second parameters defining a detection operating point of the digital circuit;
c) determining, for said value of the first parameter, a second value of the second parameter above which the digital circuit is in malfunction;
d) calculating, for the detection operating point, a correction margin equal to the difference between the first and second values of the second parameter.

In a preferential embodiment of the calibration method, steps a) to d) of the calibration method are carried out for a plurality of control circuits having a structure identical to the digital circuit, for a same given value of the first parameter, so as to obtain several correction margins relative to the sensor, and further comprising a step of determining an optimum correction margin associated with the value of the first parameter of the detection operating points from correction margins relative to the sensor.

The optimum correction margin may be an arithmetic mean of the correction margins relative to the sensor or the lowest of the correction margins relative to the sensor.

According to a development of the calibration method, the second parameter is the frequency of the clock signal and each correction margin is a frequency margin.

According to another development of the calibration method, the second parameter is the period of the clock signal and each correction margin is a time margin.

According to another development of the calibration method, the second parameter is chosen from among the supply voltage and the bias voltage of the digital circuit and each correction margin is a voltage margin.

Preferably, the second value of the second parameter is obtained by activating a critical data conducting path and by modifying progressively the second parameter up to causing a time violation of the data signal received by the sequential element arranged on the critical path, with respect to an active edge of the clock signal.

Steps a) to d) are advantageously carried out for several values of the first parameter.

The determination method and the calibration method according to the invention may also have one or more of the characteristics below, considered individually or according to all technically possible combinations thereof;
the detection window is located before an active edge of the clock signal;
the detection window is between 10% and 50% of a period of the clock signal;
one of the first and second parameters is chosen from among the frequency and the period of the clock signal and the other of the first and second parameters is chosen from among the supply voltage and the bias voltage of the digital circuit.

Another aspect of the invention relates to a digital electronic circuit comprising:
a plurality of sequential elements;
data conducting paths between the sequential elements, at least one of the data conducting paths being critical in terms of data propagation delay;
a clock tree delivering a first clock signal for clocking the sequential elements;
a time fault sensor of preventive type coupled to one of the sequential elements, receiving as input a data signal arriving at the sequential element and configured to detect, during a detection window, a transition of the data signal;
means for setting at least one first and one second operating parameter of the digital circuit;
a controller configured to implement, during a characterization phase, the following steps:
e) activating a data conducting path up to the sequential element coupled to the sensor;
f) determining, for a given value of the first parameter, a first value of the second parameter from which the sensor detects a transition of the data signal during the detection window, said values of the first and second parameters defining a detection operating point of the digital circuit;
g) determining an optimum operating point associated with the detection operating point, by adding to the first value of the second parameter, a predetermined correction margin in relation with a limit value of the second parameter which would lead to a malfunction of the digital circuit, for the given value of the first parameter, said correction margin being associated with the given value of the first parameter of the detection operating point.

According to a development of the digital electronic circuit, the controller is further configured to implement, during a calibration phase, the following steps:
a) activating a data conducting path up to the sequential element coupled to the sensor;
b) determining, for a given value of the first parameter, a first value of the second parameter from which the sensor detects a transition of the data signal during the detection window, said values of the first and second parameters defining a detection operating point of the digital circuit;
c) determining, for said value of the first parameter, a second value of the second parameter above which the digital circuit is in malfunction;

d) calculating, for the detection operating point, a correction margin equal to the difference between the first and second values of the second parameter.

In a preferential embodiment, the digital electronic circuit comprises:
- a device for on-line monitoring the operation of the digital circuit, comprising a chain of delay cells of which the propagation delay varies in the same way as the propagation delay through the critical path and configured to deliver a digital signature representative of a ratio between the period of said clock signal and the propagation delay through a critical path;
- a processing module configured to compare the digital signature of the monitoring device with a reference signature, the result of the comparison being used to command the means for setting said operating parameters.

Preferably, the controller is further configured to determine a set of optimum operating points of the digital circuit, the set of optimum operating points constituting an optimum operating curve delimiting respectively desired and undesired operating zones, and said controller is further configured to:
- identify segments of the optimum operating curve for which the digital signature delivered by the on-line monitoring device has a single value;
- recording in a memory coupled to the processing module a zone of operating points corresponding to each identified segment and the associated reference signature, the associated reference signature being a function of the value of the digital signature delivered by the on-line monitoring device for the operating points of the identified segment;
- selecting, in the memory, the reference signature associated with the zone of operating points including a current operating point of the digital circuit, the selected reference signature being used by the processing module to command the means for setting the operating parameters.

BRIEF DESCRIPTION OF THE FIGURES

Other characteristics and advantages of the invention will become clear from the description that is given thereof below, by way of indication and in no way limiting, with reference to the appended figures, among which.

For greater clarity, identical or similar elements are marked by identical reference signs in all of the figures.

DETAILED DESCRIPTION OF AT LEAST ONE EMBODIMENT

Numerous parameters have to be taken into consideration to verify that the time constraints in a digital circuit in synchronous logic are respected. The frequency of the clock signal is, obviously, an important criterion because the set-up time and hold time constraints of the components of the circuit are defined with respect to an active edge of the clock signal. Nevertheless, the supply voltage, the bias voltage of the substrate and the temperature also play a role in the respect of time constraints, because these parameters are going to influence data propagation delays in the circuit.

Here it is aimed to determine the values of two of these parameters which will make it possible to operate the digital circuit in an optimum manner, taking account of the environment in which it is placed. It involves, for example, determining the maximum frequency of the clock signal that the circuit can withstand, given its supply voltage. It may be wished on the contrary to determine the minimum supply voltage acceptable by the circuit, at a given operating frequency, in order minimise its electrical consumption.

Figure 3:
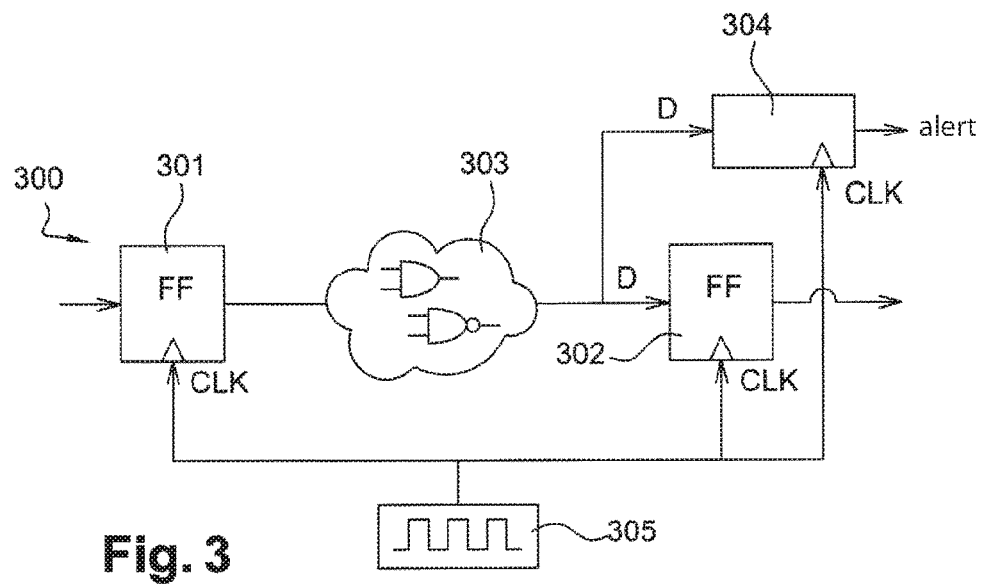
FIG. 3 schematically represents a part of a digital circuit of which the optimum operation is determined thanks to the characterization method according to the invention, FIG. 4A schematically represents a time fault sensor which can be used in the characterization method according to the invention

FIG. 3 represents a part of a digital circuit 300 of which it is wished to optimise the operation, notably in terms of operating speed or energy consumption. The digital circuit is, as an example, a microprocessor capable of carrying out a multitude of operations, such as additions.

This circuit 300 comprises a plurality of sequential elements, preferably of flip-flop type, of which at least one departure sequential element 301 and one destination sequential element 302. Typically, each sequential element of flip-flop type forms a part of a register, which is used to store temporarily a digital data (1 flip-flop per data bit). The departure sequential element 301 is connected to the destination sequential element 302 by a data path 303, in which travels a data signal D. The data path 303 conventionally comprises logic gates, traversed by the data signal D and laid out together to fulfill a certain logic function.

The circuit further comprises a time fault sensor 304 coupled to the destination sequential element 302. This sensor 304 receives as input the data signal D from the critical path 303 and arriving at the destination flip-flop 302. The sequential elements 301-302 and the time fault sensor 304 are set in time by a clock signal CLK coming from a clock tree 305. Thus, the flip-flop 302 and the sensor 304 share the same input signal D and the same clock signal CLK.

The sensor 304 is of preventive type, that is to say that it anticipates time faults in the digital circuit. Its role is to detect a transition of the data signal D during an observation window placed before the active edge of the clock signal (i.e. the edge that triggers the flip-flops). In the case where a set-up time must be respected in front of an active edge of the clock signal, it will obviously be necessary that the observation window starts before this set-up time so that the sensor makes it possible to anticipate time faults. As is described in detail hereafter, the warning supplied by the sensor makes it possible to determine an optimum operating point of the circuit.

Figure 1:
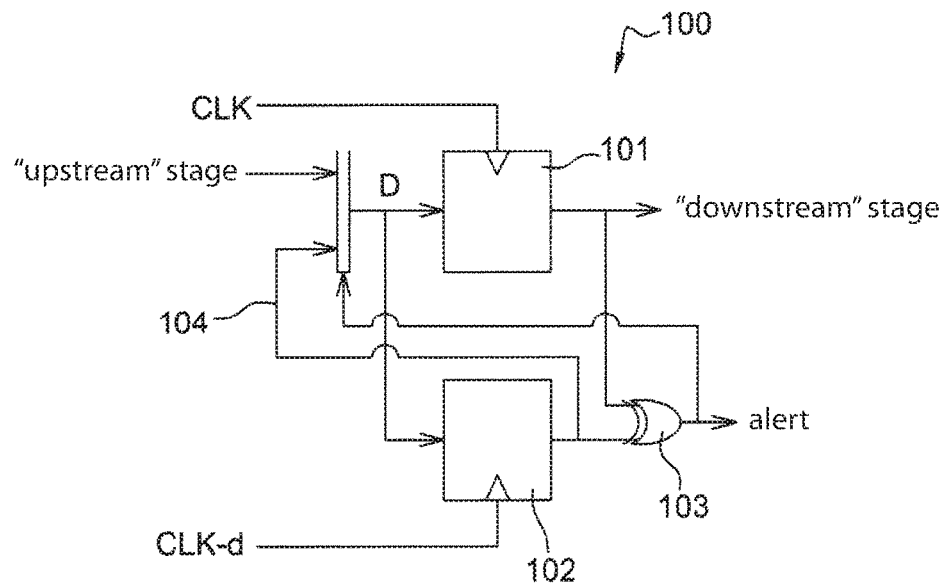
FIG. 1, described previously, represents a first device for detecting time violations according to the prior art.
Figure 2:
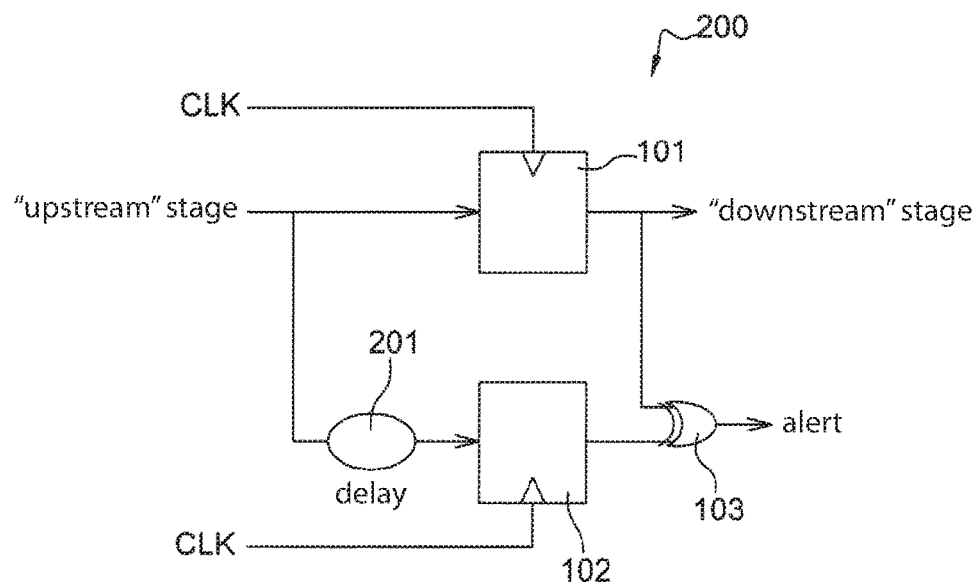
FIG. 2, described previously, represents a second device for detecting time violations according to the prior art.

The sensor 304 and the destination flip-flop 302 may together form a device of "Canary Flip-Flop" type, as described previously in relation with FIG. 2. The sensor 304 then comprises another flip-flop, identical to the flip-flop 302, a delay cell at the input of this second flip-flop and a system for comparing values at the output of the two flip-flops. The detection window is in this case defined by its ends which are the instants where each flip-flop samples the data signal (one of the ends is the active edge of the clock signal, the other is situated earlier in the clock cycle). A transition of this signal is detected when the values at the two instants (i.e. at the output of the two flip-flops) differ.

In a preferential embodiment, the time fault sensor 304 is a transition monitoring device, such as described in the application WO2010/122036. This type of sensor monitors the activity of the data signal over a whole period, unlike the "Canary Flip-Flop" device.

Figure 4A:
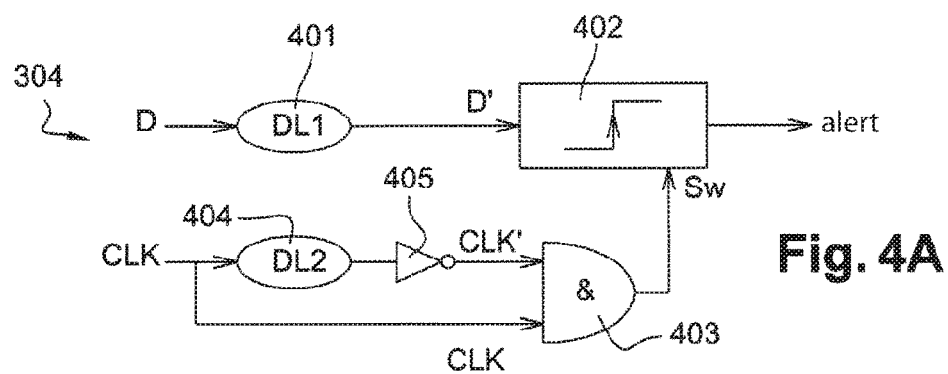
FIG. 4B represents signals of this sensor.
Figure 4B:
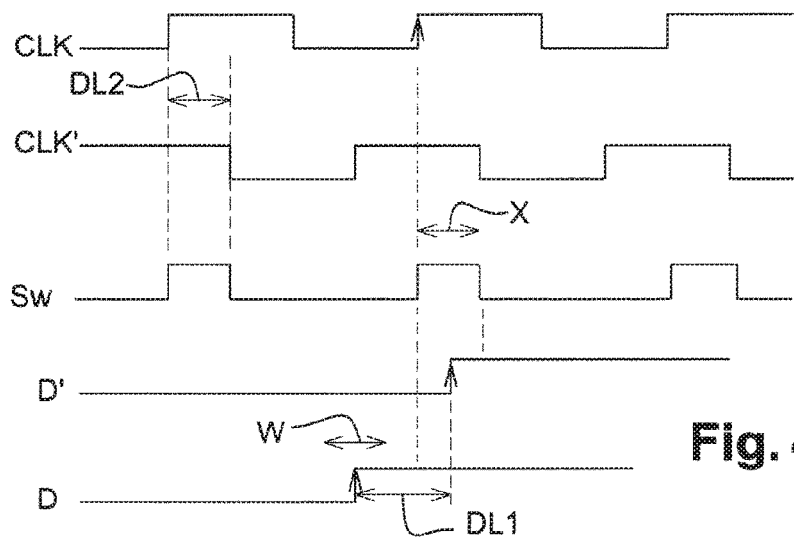

FIG. 4A is a block diagram of a preferential embodiment of the monitoring device 304, whereas FIG. 4B represents some of its signals in the form of chronograms.

The monitoring device 304 comprises a first delay cell 401 receiving as input the data signal D. The cell 401 introduces a delay DL1 in the data signal D. Consequently the signal at the output of the cell 401, noted D' in FIGS. 4A and 4B, is shifted by a time period equal to the delay DL1 with respect to the data signal D (FIG. 4B).

The delayed signal D' is directed to the input of a transition detector 402, which observes the activity of the signal D' during a detection period X of the clock cycle. This detection period X starts from an active edge of the clock signal CLK, (for example the rising edge—FIG. 4B). It corresponds to a signal $S_W$ generated from the clock signal CLK and a signal CLK' inverted and delayed with respect to the clock signal CLK. The device 304 comprises to this end a "AND" gate 403, of which the inputs correspond to the signals CLK and CLK' and of which the output forms the signal $S_W$. The signal CLK' is derived from the signal CLK by means of a second delay cell 404 and an inverter 405 connected in series.

In an artificial manner using the shift DL1, the detector 402 observes, after the active edge of the clock signal, the activity of the data signal D taking place during a window W preceding this clock edge. In fact, when a transition of the signal D' is detected during the period X, this means that a transition of the data signal D has taken place an instant earlier, during the window W. The delay DL1 introduced by the cell 401 determines the position of the observation window W in the clock cycle (because the shift DL1 lies between the period X and the window W). The delay DL2 introduced by the cell 404 fixes the duration of the detection period X, equal to the duration of the observation window W.

Unlike conventional on-line monitoring techniques, the time fault sensor 304 of FIG. 3 is here configured to detect a time fault very early in the clock cycle. To this end, the sensor may then have a detection window W placed just before the active edge of the clock signal and covering a large part of the clock cycle. Its duration is, preferably, comprised between 10% and 50% of a clock cycle.

The window W may also be short (duration comprised between 5% and 10% of a clock cycle) and placed well before the rising clock edge. The start of this short window takes place at the same instant as that of the long window, at 10%-50% of the clock period before the rising edge. This is equivalent to reducing the delay DL2 while keeping the same delay DL1.

Figure 5A:
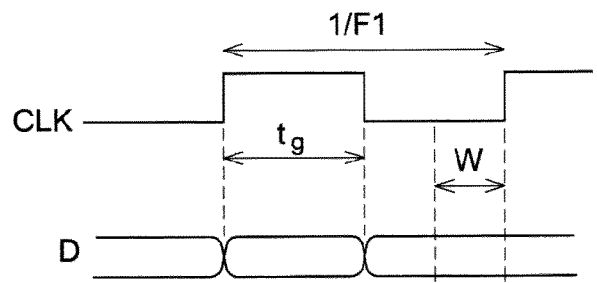
FIGS. 5A to 5C are examples of chronogram illustrating the application of the time fault sensor in the characterization method according to the invention.
Figure 5B:
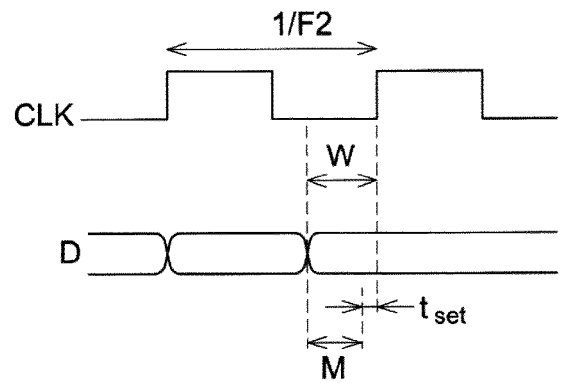
Figure 5C:
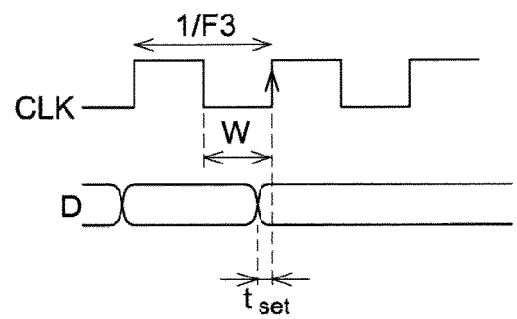

FIGS. 5A to 5C are examples of chronogram that illustrate this particular use of the time fault sensor 304.

The chronograms of FIG. 5A represent a clock signal CLK at a clock frequency F1 and a data signal D at the input of the destination flip-flop. The propagation time $t_G$ of the data signal D, also called "arrival time" (at the input of the flip-flop), starts at the first rising edge of the clock signal CLK and ends before the detection window W of the sensor (itself placed just before the following rising edge). Since the sensor does not see any transition of the signal D during the window W, it does not emit any alert.

In FIG. 5B, the clock signal has a frequency F2 higher than the frequency F1. The data D stabilises at the input of the detection window W. In this case, the sensor 304 sees a transition of the data signal D and indicates that a time fault has occurred. Nevertheless, this fault only has an informative character, it is not synonymous with an error of the flip-flop, because the set-up time $t_{set}$ of the flip-flop has not been violated. In fact, there still exists a certain margin M between the start of the detection window W and the first instant where the set-up time $t_{set}$ is violated. FIG. 5B thus represents a non-optimised operating point if the flip-flop associated with the sensor is uniquely considered, because the detection margin M could be reduced.

Nevertheless, if the sensor 304 is not associated with the most critical data path of the circuit, it is desirable to have a margin M at least equal to the difference in the propagation times between the critical path of the circuit and the data path associated with the sensor. Thus, this sensor makes it possible to estimate the probability of error on another more critical path.

In FIG. 5C, the frequency F3 of the clock signal CLK is such that the propagation time of the data signal D ends at the limit of violation of the set-up time $t_{set}$. In other words, the margin M of FIG. 5B no longer exists and a higher clock frequency would cause a violation of the set-up time $t_{set}$ of the flip-flop associated with the sensor 304 (because the active edge of the clock signal CLK would be found opposite the unstable state of the signal D). FIG. 5C thus represents an optimum operating point for the flip-flop associated with the sensor 304. The frequency F3 corresponds substantially to the maximum frequency that the circuit can withstand if the data path associated with the flip-flop is the most critical path.

It may be seen, in accordance with FIGS. 5A to 5C, that the fact of using a wide detection window makes it possible to read "time faults" at a clock frequency (F2) much lower than the maximum clock frequency F3. Conversely, in solutions of the prior art, the detection window of the sensor is restricted and located uniquely around the active edge, in order to approach as closely as possible the maximum frequency and to only verify violations of the set-up time $t_{set}$ (and/or hold time). A long window would cause in the "Canary flip-flop" device of FIG. 2 a very early detection and would result (according to the conventional "DFS" approach) in an operating frequency far from the maximum frequency.

On this basis, an embodiment of the characterization method according to the invention consists in detecting a first operating point of the digital circuit, distant from the optimum operating point (for example, having a clock frequency F2 lower than the allowed maximum frequency F3), then in correcting this detected operating point, knowing the shift (F3-F2) that separates it from the optimum operating point. As is described hereafter in relation with the calibration method, the shift has been calculated beforehand after searching for the operating limit of the digital circuit, in other words after searching for the frequency F3 which leads to a fault on a critical path of the circuit.

Each operating point is defined by at least two operating parameters. Preferably, one of the two parameters is the frequency of the clock signal. The other parameter (or the other parameters, if more than two) is advantageously chosen from among the supply voltage of the digital circuit, the bias voltage of the substrate which serves as support to the digital circuit and the operating temperature. For the needs of this characterization, the digital circuit thus comprises means for varying these parameters. As an example, the clock frequency is set using a phase-locked loop (PLL) or frequency-locked loop (FLL). The supply and bias voltages may be set by means of DC-DC converters.

Taking account of the operating temperature adds an additional degree to the characterization of the circuit (each operating point is then defined by three values of parameters). The clock frequency, the supply voltage and/or the bias voltage may then be determined for several temperature values. It is thus possible to obtain information on the temperature behaviour of the circuit. Nevertheless, unless having available means for heating or cooling the circuit, it is not possible to command/set the temperature by means of a dedicated actuator. The temperature will thus most often be one of the environmental parameters that is undergone and to which it is necessary to adapt.

Let us consider in a first exemplary embodiment of the characterization method that it is wished to determine the maximum clock frequency for a given value of the supply voltage. This example is described below in relation with FIG. 6 and the value of the voltage is noted V1.

During a first step of this characterization method, the value $F_{d1}$ of the clock frequency is determined from which the sensor detects a time fault, that is to say a transition of the data signal during the detection window. To do so, the frequency may be increased progressively by means of the phase locking loop, up to the moment that the transition of the data signal D "enters" into in the detection window W (cf. FIG. 5B).

The data path up to the flip-flop coupled to the sensor needs to be activated in order that the sensor can (potentially) detect a transition. An operation, of which it is known that it produces a signal travelling the data path associated with the sensor, is supplied to the digital circuit. This operation, for example an operation of addition with carry, may have been determined beforehand during the choice of the emplacement of the sensor (a certain operation is executed by the circuit and the sensor is arranged in the path as the active operation).

This operation is not necessarily the most critical operation in terms of propagation delay (i.e. arrival time). In fact, unlike solutions of the prior art, the time fault sensor 304 may here be coupled to a flip-flop situated in a less critical data path, because the window is sufficiently in advance of the edge to detect the transition of the data signal (the data travelling on a non-critical path is stable before that travelling on a critical path). Yet, it is preferable to add sensors on not very critical paths, rather than on the most critical in delay, because thus they will affect the time performances of the circuit to a lesser extent.

Figure 6:
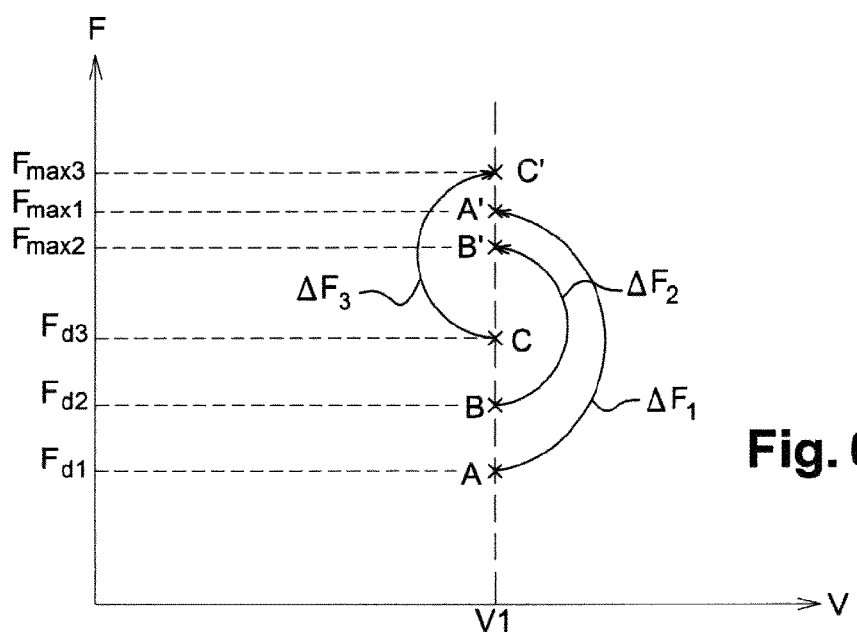
FIG. 6 is a graph of the frequency F of the clock signal as a function of the supply voltage V of the circuit, representing several operating points in accordance with a first exemplary embodiment of the characterization method according to the invention.

At the end of this first step, a first operating point A, defined by the value V1 of the supply voltage and the clock frequency value $F_{d1}$, is obtained (FIG. 6).

As indicated previously, this first operating point A is not optimum, because an important superfluous margin exists due to the fact that the detection window is wide. Thus, during a second step of the characterization method, the operating point A is corrected, by adding to the frequency $F_{d1}$ a predetermined frequency margin $\Delta F_1$. This margin $\Delta F_1$ is less than or equal to (depending on the degree of "criticality" of the path coupled to the sensor) the difference M which separates the start of the detection window (FIG. 5B) from the instant where the set-up time of the flip-flop risks being violated (FIG. 5C). The corrected point A' conserves the same voltage value (V1), but has available an increased frequency value $F_{max1}$ ($F_{max1}=F_{d1}+\Delta F_1$), by a factor $\Delta F_1$ which is representative of the difference between the propagation time of the most critical path and the data path associated with the sensor.

Preferably, the digital circuit comprises a plurality of time fault sensors, each coupled to one of the sequential elements of flip-flop type of the circuit, and the preceding steps are carried out for each of these sensors. Since these sensors are coupled to different destination flip-flops, and are thus associated with distinct data paths, they do not react to the same stimuli (i.e. operations that process the circuit and activate the data paths). It will be ensured to apply a set of stimuli making it possible to activate the set of data paths associated with sensors. This set of stimuli is repeated for each frequency considered. Since the data paths associated with the sensors are different and the detection windows potentially different for each sensor, it is highly probable that the sensors begin to detect an "error" at different frequencies. The detection frequencies of transitions may thus vary.

A plurality of operating points A, B, C is then obtained. Each point corresponds to the measurement of a frequency at which one of the sensors becomes apparent. These points have in common the value V1 of the supply voltage. In fact, at the moment of characterizing the circuit, the sensors are activated in turn but the supply voltage V does not vary.

The circuit includes for example 128 sensors. Nevertheless, in the graph of FIG. 6, only three points A, B and C (corresponding to the readings of 3 sensors) are represented for reasons of clarity. They have respectively for Y-coordinates the frequencies $F_{d1}$, $F_{d2}$, $F_{d3}$.

The operating points B and C are corrected by adding to them a frequency margin, as is described above in relation with the first point A. The correction margins of points B and C are noted respectively $\Delta F_2$ and $\Delta F_3$ and the corresponding corrected points are designated B' and C' in FIG. 6.

The values of the correction margins $\Delta F_1$ to $\Delta F_3$ are such that the corrected points A', B' and C' from the different sensors are, in practice, very close to each other (overall, the lower the detection frequency $F_d$, the greater the corresponding margin $\Delta F$). The manner in which these correction margins $\Delta F_1$ to $\Delta F_3$ are calculated will be described hereafter, in relation with FIGS. 9 and 10.

After having obtained several corrected operating points A', B' and C', as represented in FIG. 6, the characterization method comprises a step of determining a single optimum operating point of the circuit from these corrected operating points. This optimum operating point is, in a certain manner, a synthesis of the indications given by the different sensors on the frequency behaviour of the circuit.

In a preferential embodiment, this optimum operating point is defined by the value V1 of the supply voltage and by an arithmetic mean of the corrected frequencies $F_{max1}$ to $F_{max3}$. This means makes it possible to compensate errors of estimation made on each of the correction margins $\Delta F_1$ to $\Delta F_3$. In other words, the optimum frequency may be higher than the corrected frequency values of one or more sensors. By making the circuit operate at such a mean frequency, set-up time violations risk occurring at the input of the flip-flops associated with the most critical paths. In order to remedy this, a carefully calibrated safety margin is taken into account. This safety margin is described in relation with FIG. 11.

Alternatively, the optimum operating point is defined by the value V1 of the supply voltage and the lowest of the corrected frequency values $F_{max1}$ to $F_{max3}$, i.e. point B' in the example of FIG. 6. In this variant of embodiment, the operating frequency is limited to the worst case but considerably reduces the risk of violation of the set-up time of the flip-flops associated with the most critical paths.

In a more general manner, the optimum operating point may be derived from the corrected operating points, by applying various mathematical operations to the frequencies $F_{max1}$ to $F_{max3}$, such as a weighted average (the weights being, preferably, a function of the degree of criticality of the paths coupled to the sensors).

If these operations are now repeated for different values of the supply voltage V, it is possible to establish a curve characteristic of the clock frequency $F_d$ at which each sensor detects a fault, as a function of the supply voltage V, and another curve representing the maximum frequency $F_{max}$ of the circuit as a function of the voltage V, from characteristic curves of the different sensors.

Figure 7:
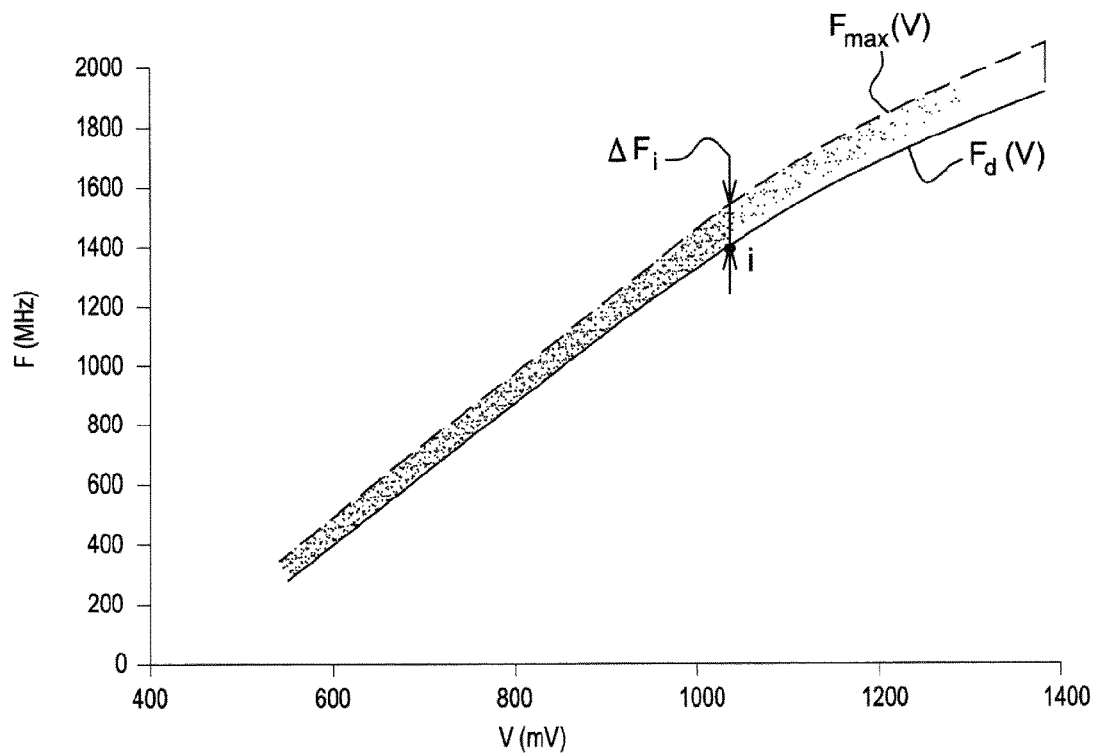
FIG. 7 represents, as a function of the supply voltage V, the frequency of the clock signal $F_d$ detected by means of the sensor of FIG. 4A and the maximum frequency $F_{max}$ of the circuit estimated in accordance with the information of this sensor.

FIG. 7 shows an example of frequency curve $F_d(V)$ obtained with the aid of a time fault sensor (solid line) and an example of curve of the estimated maximum frequency of the circuit $F_{max}(V)$, relative to this sensor (dotted line). The curve $F_{max}(V)$ is obtained, by applying to each point i of the curve $F_d(V)$, a frequency correction margin $\Delta F_i$ associated with this point.

The correction margin $\Delta F_i$ generally varies as a function of the operating point read by each sensor. Two points read by two different sensors, having the same voltage but different frequencies (A and B for example), may have different correction margins ($\Delta F_1$ and $\Delta F_2$). Two points read by a same sensor but at different voltages may also have different correction margins.

Figure 8:
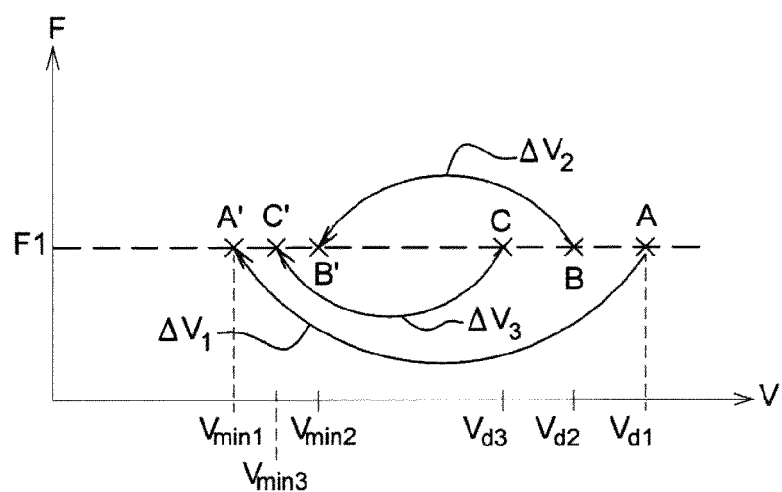
FIG. 8 is a graph of the supply voltage V of the circuit as a function of the frequency F of the clock signal, representing several operating points in accordance with a second exemplary embodiment of the characterization method according to the invention.

In a second exemplary embodiment of the characterization method represented in FIG. 8, it is wished rather to determine the minimum supply voltage at constant clock frequency. The situation is thus the opposite to that described previously: the supply voltage V is reduced step by step and the frequency is fixed, at a value F1.

By reducing the supply voltage, the propagation time of the data signal D at the input of the destination flip-flop is extended. The measurement principle is thus unchanged, because rather than moving the active edge of the clock signal towards the left, it is the propagation time $t_G$ which extends to the right, up to the detection window W (FIG. 5A-C).

In FIG. 8, the supply voltage V is reduced to the point A where a first sensor detects a transition of the data signal at the input of its detection window. This first voltage value for which the sensor detects a fault is noted $V_{d1}$. It is however known that the supply voltage could be further reduced, to take account of the margin M taken for the detection (FIG. 5B). Thus, a correction margin $\Delta V_1$ is applied to move the operating point A to a lower voltage $V_{min1}$. A' designates the operating point thus corrected. This voltage margin $\Delta V_1$ is, by convention, chosen negative and added to the value $V_{d1}$ ($V_{min1} = V_{d1} + \Delta V_1$).

As previously, it is possible to provide several time fault sensors in the circuit and thus to obtain several corrected operating points A', B' and C', each being relative to a sensor and characterized by a minimum value of the supply voltage, respectively $V_{min1}$, $V_{min2}$ and $V_{min3}$. Each minimum value $V_{min1}$, $V_{min2}$ and $V_{min3}$ is determined from a voltage detection value, respectively $V_{d1}$, $V_{d2}$ and $V_{d3}$, and a voltage margin associated with each sensor which may be a function of this detection voltage, respectively $\Delta V_1$, $\Delta V_2$ and $\Delta V_3$.

An optimum operating point may then be deduced from the corrected operating points, for example by calculating the mean of these minimum voltage values or by taking, by precaution, the highest of them.

Similarly, it could be possible to establish a curve characteristic of the minimum supply voltage of the digital circuit as a function of the clock frequency, by obtaining from the sensor(s) a plurality of corrected operating points at different frequency values.

In the examples of the above characterization method, it may be observed that the determination of an operating point (for example A) is carried out by varying a parameter chosen from among the clock frequency F and the supply voltage V.

A preferential manner for determining, for each operating point, the correction margin (in frequency or in voltage) will now be described in relation with FIGS. 9 and 10.

The determination of the correction margins is here the subject of a method for calibrating the digital circuit. This calibration method uses the same means as those described previously: the digital circuit of FIG. 3 equipped with at least one time fault sensor 304 coupled to one of the sequential elements 302.

Figure 9:
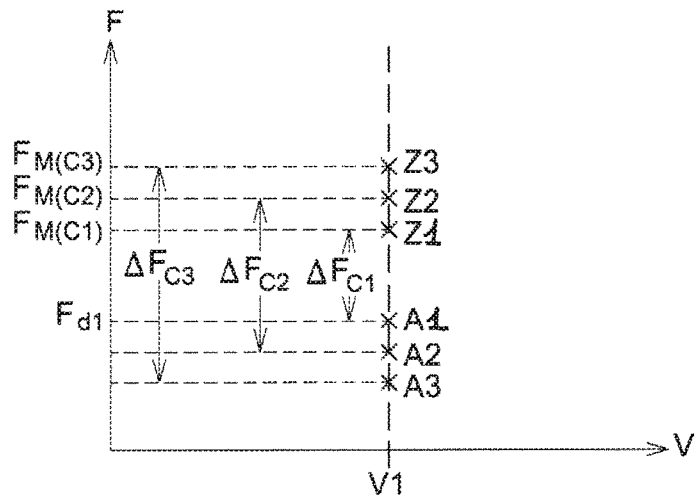
FIG. 9 is a graph of the frequency F of the clock signal as a function of the supply voltage V of the circuit, representing the determination of the frequency correction margins $\Delta F_i$ in accordance with a calibration method according to the invention.

FIG. 9 represents an example of calculation of a frequency correction margin.

The first step of the calibration method is identical to the first step of the characterization method. It consists in measuring, for a value of supply voltage V1, the value $F_{d1}$ of the clock frequency, from which the sensor sees a transition of the data signal. A first operating point A1, representative of the start of the detection window (FIG. 5B), is thus obtained.

During a second step, the digital circuit is characterized to determine its absolute maximum frequency $F_{M(c1)}$. The value of the supply voltage V1 is not modified during this characterization. The maximum frequency $F_{max1}$ is qualified as "absolute" because it is not relative to a time fault sensor unlike the maximum frequency $F_{max1}$ determined during the characterization method (which is based on the detected frequency $F_{d1}$—FIG. 6). It is the frequency above which the circuit is in malfunction.

The characterization of the absolute maximum frequency $F_{M(c1)}$ may be carried out by the "overclocking" technique. This consists in pushing up the frequency of the circuit until causing its failure. In practice, a multitude of operations is supplied to the digital circuit so as to activate the most critical of the data paths (which is not necessarily equipped with a sensor). The activation of this path is going, beyond a certain frequency, to cause a time violation of a sequential element of the circuit arranged in this path and place the circuit in an error state. For example, the set-up time or the hold time of the data signal at the input of this sequential element will be violated.

In FIG. 9, the operating limit of the circuit corresponds to an operating point Z1 of which the voltage-frequency coordinates are the values V1 and $F_{M(c1)}$.

In this calibration method, the frequency margin is considered as equivalent to the difference between the absolute maximum frequency $F_{M(c1)}$ of the circuit and the frequency value $F_{d1}$ relative to the sensor.

Thus, during a third step of the method, a frequency correction margin $\Delta F_{C1}$ relative to the operating point A1 is determined, by calculating the difference between the values $F_{M(c1)}$ and $F_{d1}$ determined during the two preceding steps.

Obviously, the detection frequency $F_{d1}$ and the absolute maximum frequency $F_{M(c1)}$ may be measured for different values of the supply voltage V, and not only the value V1 above, in order to obtain frequency margins $\Delta F_{c1}$ for all the operating points relative to the sensor, that is to say for all the points of the curve $F_d(V)$ (FIG. 7). The margin thus calculated for each value of the supply voltage may furthermore be expressed in the form of an equation $\Delta F_{C1}(V)$.

Moreover, to refine the calculation of the frequency margins, the different steps of the calibration method may be carried out for several units C1 to C3 of the digital circuit. Control circuits, having a structure identical to the digital circuit of FIG. 3, are used for this purpose. They comprise notably one or more fault sensors arranged at the same emplacements as that or those of the digital circuit of FIG. 3.

Each control circuit is characterized to determine its absolute maximum frequency and the frequency at which the same sensor detects a fault. These frequencies can vary slightly from one control circuit to the next, due notably to variability in the method of manufacture of these circuits. In FIG. 9 is shown (at the value V1 of the supply voltage) the absolute maximum frequency of two of these control circuits (circuits C2-C3), in addition to the frequency $F_{M(c1)}$ calculated previously (for the circuit C1). These frequencies are noted $F_{M(c2)}$ and $F_{M(c3)}$, and correspond to the points Z2 and Z3. Similarly, the detection point of the sensor in the two additional control circuits, A2 and A3, is shown.

Finally, for each control circuit, the difference between the absolute maximum frequency and the frequency value detected by means of the sensor is calculated. Thus, second and third values of the frequency margin $\Delta F_{C2}$ to $\Delta F_{C3}$, relative to the same sensor and to the value V1 of the supply voltage, are obtained.

An optimum correction margin $\Delta F$ of the operating point A of a sensor is advantageously determined from the different correction margins $\Delta F_{C1}$ to $\Delta F_{C3}$ relative to the sensor. In a preferential embodiment, this optimum margin is an arithmetic mean of the correction margins $\Delta F_{C1}$ to $\Delta F_{C3}$ calculated beforehand. Alternatively, the optimum correction margin may be the most pessimistic of the values $\Delta F_{C1}$ to $\Delta F_{C3}$, that is to say the lowest among them, such that the margin thus selected is suitable whatever the digital circuit used. The greater the number of control circuits, the more accurate the determination of the correction margin.

Figure 10:
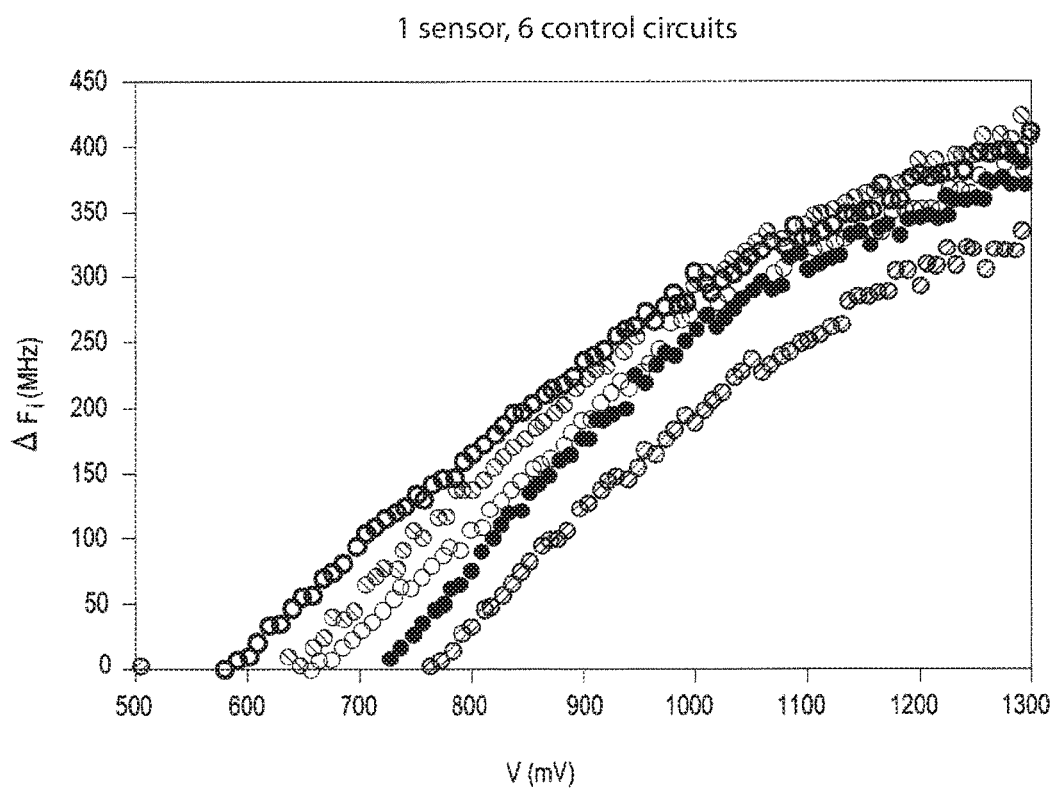
FIG. 10 represents, as a function of the supply voltage V, the frequency correction margin $\Delta F_i$ calculated with the aid of the calibration method according to the invention for 6 control circuits of identical structure.

FIG. 10 represents, as a function of the supply voltage V, the frequency margin $\Delta F_i$ relative to a sensor of the digital circuit, calculated with reference to 6 control circuits in accordance with the calibration method. It may be noted that the 6 curves substantially have the same shape and that small differences separate different margins relative to the same sensor. These differences are representative of variations in the absolute maximum frequency and in the detection frequency among the 6 control circuits, notably due to variations in the manufacturing method.

The calculation of a voltage margin may be carried out in a similar manner, by measuring (for a fixed clock frequency) a value $V_{d1}$ of the supply voltage which makes it possible to detect a transition and by measuring the absolute minimum voltage $V_{m(c1)}$ of the digital circuit, that is to say the supply voltage below which time violations cause an error of the circuit. Then, the voltage margin $\Delta V_{c1}$, equal to the difference between these two values, is calculated.

As previously, several control circuits may be characterised in order to determine several values of the absolute minimum voltage and several margin values relative to a same operating point. The different margins are then averaged or the most pessimistic of them (i.e. the lowest) is selected.

The calibration of the circuit, during which the correction margins are determined, is carried out prior to the use of the circuit, for example when it leaves the factory. It is long to implement, because it requires testing in depth the circuit (to determine its operating limit). On the other hand, it makes it possible to obtain, in one go for each type of digital circuit, the frequency, or voltage, correction margins to apply for a given sensor.

When it is wished later to optimise the operation of the circuit during its use to define points of the maximum frequency curve $F_{max}(V)$, it suffices in practice with the aid of time fault sensors to read a certain number of detection operating points and to apply to them the corresponding correction margin calculated beforehand or easily calculable on the basis of the elements obtained during the method of manufacture. The circuit is only used temporarily for the purpose of updating the characteristic $F_{max}(V)$, with a reduced number of operations. Thus, thanks to the fact that the correction margins have been predetermined or that a means for calculating them has been predetermined during the calibration method, the characterization method is a very short process, which may be implemented on several occasions over time, notably to take into account the ageing of the circuit or new environmental conditions. It will be noted that the characterization method may be made transparent for the user, for example in the case of a SOC type circuit comprising several processing units and for which a processing unit is momentarily unused. Moreover, this transparency is also possible if the current activity of the circuit makes it possible to activate the data path(s) connected to the sensors. In so far as the sensors are of preventive type, it is possible to vary momentarily the operating parameters (Vdd, F) (if the general control system of the circuit allows it) for the needs of execution of the characterization method, without placing the circuit in default.

The digital electronic circuit comprises means for implementing the characterization method for determining at least one optimum operating point ($V_{min}$; $F_{max}$) present for the circuit, at a given instant. It comprises, preferably:

- a device for measuring, at a value V1 of the supply voltage (respectively the frequency; F1), a value $F_{d1}$ of the frequency (respectively the voltage; $V_{d1}$) from which the sensor detects a transition of the data signal during the detection window,
- a calculator device configured to add to one of the values of the voltage V1 or the frequency $F_{d1}$ (respectively F1 or $V_{d1}$) a predetermined correction margin, which is a function of the detection operating point (V1; $F_{d1}$) (or respectively ($V_{d1}$, F1)) and obtain an optimum operating point (V1, $F_{max}$(V1)) (or respectively ($V_{max}$(F1), F1)).

The predetermined correction margin having to be added by the calculator corresponds to the optimum correction margin $\Delta F$ (respectively $\Delta V$) associated with the detection point considered (and notably with the voltage value V1 of this point—respectively the frequency value F1 of this point) which has been determined beforehand during the calibration method. In other words, this predetermined correction margin corresponds to the difference between the value $F_{d1}$ of the frequency (respectively the voltage $V_{d1}$) and an absolute frequency value $F_M$ (respectively the absolute voltage $V_M$) above which the digital circuit is in malfunction.

It will be noted that, ideally, it would be necessary to implement the calibration method on each circuit in order to determine, for each sensor of the circuit, the optimum correction margin $\Delta F$ (respectively $\Delta V$) associated with a detection point of the sensor having a given voltage V (respectively a given frequency F). Nevertheless, in practice, it may prove impossible for material or financial reasons to implement the calibration method on each circuit. A selection is made of a set of control circuits, preferably having dispersed values of technological parameters representative of variations in the manufacturing method. The calibration method as described above in relation with FIG. 9 is then carried out for this set of circuits and an optimum correction $\Delta F$ (respectively $\Delta V$) is determined as a function of the set of corrections $\Delta F_{ci}$ (respectively $\Delta V_{ci}$) obtained for these control circuits.

The correction margin associated with each detection operating point, or preferably associated with a value of a parameter of this detection operating point, may for example be recorded in a memory of the digital circuit. After having measured a detection operating point with the aid of a sensor during the characterization method, the calculator device of the digital circuit charged with applying these margins accesses the memory and may hence correct this detected operating point into a corrected operating point.

According to a variant, it is possible to memorise not the correction margin values, but a function making it possible to calculate them knowing a detection operating point. In this case, it will be necessary to calculate the correction margin prior to the calculation of a corrected operating point (V1, $F_{max}$(V1)) (or respectively ($V_{max}$(F1), F1)).

For example, the function $\Delta F(V1, F_d)$ giving the frequency correction margin of the detection operating points may be obtained by regression of different curves, each curve representing the correction margin of an example of the digital circuit as a function of the frequency detected by the sensor (i.e. the curves as in FIG. 10, except that on the X-axis is plotted the detected frequency $F_d$ rather than the supply voltage V). The regression makes it possible to obtain a single curve having an equation of form $$\Delta F(V1, F_d) = A(V1) \cdot F_d(V1) + B(V1)$$

where A and B are functions of the supply voltage V.

Figure 11:
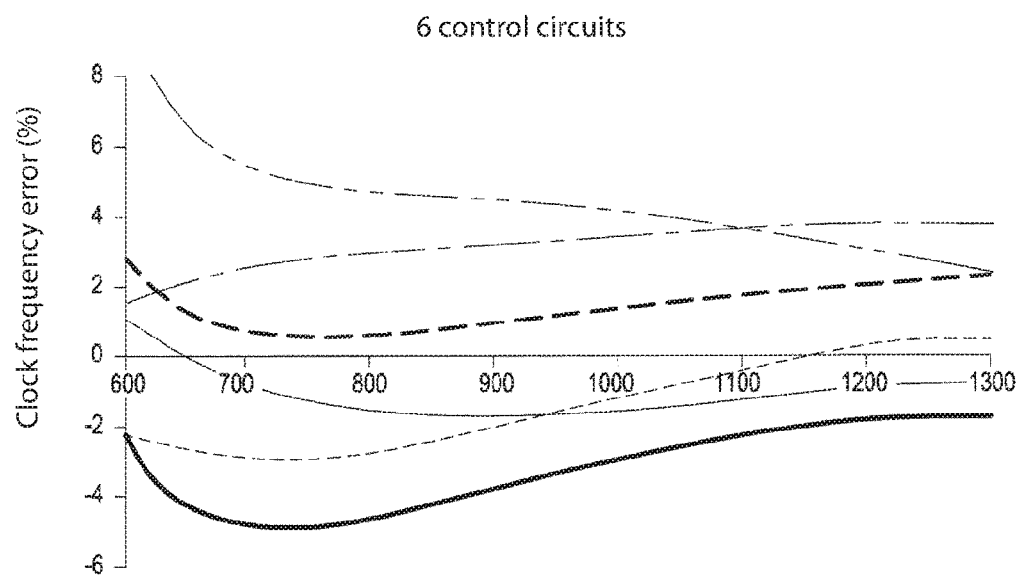
FIG. 11 represents, as a function of the supply voltage V, the overall error made in the determination of the maximum frequency of the circuit of FIG. 3, in comparison with the 6 circuits of FIG. 10, FIG. 12 schematically represents another part of a digital electronic circuit of which the operation is optimised, FIG. 13A schematically represents a preferential embodiment of an on-line monitoring device used in the circuit of FIG. 12

FIG. 11 represents, as a function of the supply voltage V, the error committed on the determination of the maximum clock frequency $F_{max}$ of the circuit in accordance with the first example of the characterization method, compared to the absolute maximum frequency of the control circuits. This figure thus represents 6 curves, each corresponding to the difference between the maximum frequency $F_{max}(V)$ determined by means of the time fault sensor(s) and the absolute maximum frequency of a control circuit. It is thus possible to verify that the characterization method is satisfactory in terms of precision, in other words that the correction margins calculated during the calibration method are correct.

For each curve of FIG. 11, i.e. each control circuit C1 to C6, the error is written:

$$\text{Error}_{(Cn)}(V) = F_{M(Cn)}(V) - F_{max(Cn)}(V)$$

where $F_{M(Cn)}$ is the absolute maximum frequency of the circuit n (n=1~6) and $F_{max(Cn)}$ is the maximum frequency of the circuit n, estimated by taking into account an optimum correction margin $\Delta F_{N\ circuits}(V)$ intersecting the correction margin values of the 6 control circuits. Furthermore, the estimated maximum frequency of the circuit n, $F_{max(Cn)}$, is a value matching several maximum frequency values corresponding to several sensors in the circuit n, as described in relation with FIG. 6.

Moreover, this graph gives a value of the minimum safety margin that can be applied to the circuit, in order to anticipate disparities due to the method of manufacture between several circuits of the same type. In this example, the clock frequency error committed is, in absolute value, less than 8%. It is thus possible to deduct from the maximum frequency obtained during the characterization the equivalent of 8% of the clock frequency.

This safety margin is only required in the case where it would be possible to carry out a mean of values over several sensors (for the determination of the maximum estimated frequency—FIG. 6) and/or several circuits (for the determination of the correction margins relative to a same sensor—FIG. 9). Unlike solutions of the prior art, it is perfectly calibrated, because it is obtained from precise measurements of the absolute maximum frequency carried out on a multitude of circuits of identical design.

Numerous variants and modifications of the calibration method and of the characterization method will become clear to those skilled in the art. In particular, these methods could be applied by considering operating parameters of the circuit other than the frequency and the supply voltage. The bias voltage of the circuit, at the level of its substrate, has for example the same effect as the supply voltage on the time constraints of the circuit. Thus, a characterization of the maximum clock frequency as a function of this bias voltage (or vice-versa) may be obtained.

Similarly, rather than considering the clock frequency, these methods may be carried out by varying the period of the clock signal. Even if a variation in the clock period implies a variation in the frequency—because it involves the same clock signal and the same actuator, a time analysis will not produce the same results as a frequency analysis, because an increment of the clock period is not equivalent to an increment of the frequency. Thus, the calibration method will then make it possible to calculate time correction margins, rather than frequency correction margins. The minimum clock period (corresponding to the maximum frequency) will then be equal to the clock period at which the time fault sensor sees a transition, plus a time margin (which is negative).

Now that optimum operating points of the digital circuit are available, represented for example by the curve of the maximum clock frequency $F_{max}$ as a function of the supply voltage V, it is desirable that the digital circuit operates as closely as possible to these ideal points, and does so even when the circuit undergoes sudden variations in its operating parameters (voltage drop, temperature rise, etc.).

Ring oscillator type or critical path replica type devices are commonly used to track dynamic variations in operating parameters. They make it possible to detect overruns of the maximum frequency $F_{max}(V)$, caused by dynamic variations. Thus, when such an overrun occurs, a possible reaction consists in reducing immediately the frequency F of the clock signal to compensate these dynamic variations.

Figure 12:
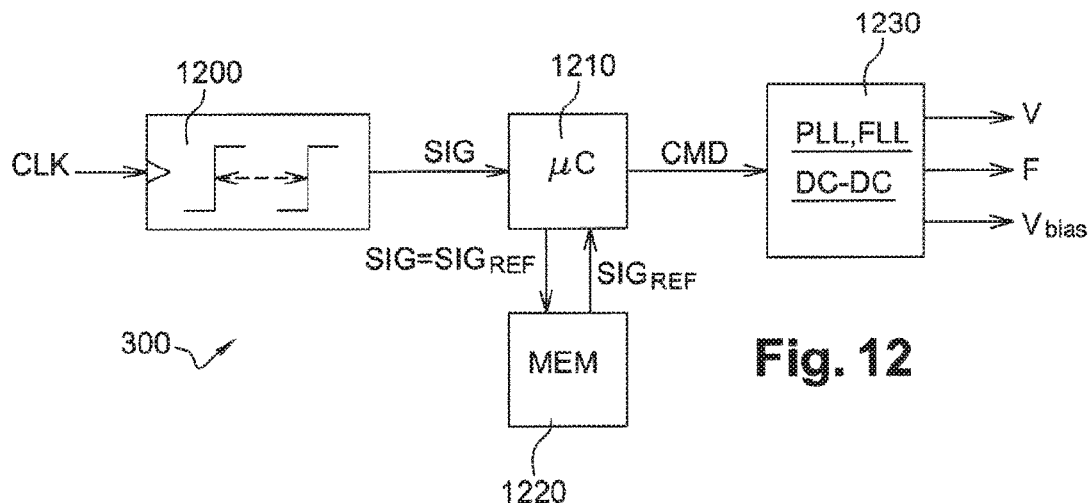

FIG. 12 represents another part of the digital electronic circuit 300 incorporating an on-line monitoring device 1200 of "critical path replica" type. An example of embodiment of this device is given in the document US2008/0104561.

The aim of the on-line monitoring device 1200 is to simulate the propagation delay in a data conducting path of the digital circuit, which is the most critical in terms of delay. To carry out this simulation, the device 1200 comprises a critical path replica, that is to say a set of logic ports of which the propagation delay varies in the same way as the propagation delay through the critical path. These logic gates are not necessarily the same as in the critical data conducting path.

The device 1200 is preferably arranged near to one of the cores of the circuit 300 comprising the critical path, such that the critical path replica is subjected to the same operating parameters (clock frequency, supply voltage, bias voltage and temperature). This guarantees good correlation between the monitoring device 1200 and the core of the circuit that it monitors. Thus, when variations in these parameters take place, the replica is influenced in the same way as the core of the circuit. It ensues therefrom that the propagation delay in the critical path replica varies in the same way as the propagation delay of a data signal travelling the critical path.

The device 1200, clocked by the clock signal CLK, further comprises a time-to-digital type converter. This makes it possible to quantify a "critical" ratio or difference between the period of the clock signal CLK and the "critical" propagation time of a signal through the critical path. The device 1200 delivers a digital value SIG, called signature. The signature SIG is, preferably, a thermometric code of several bits, for example 32 bits. "Thermometric code" designates a digital value constituted of one or more consecutive bits having the logic level '0' followed by one or more consecutive bits having the logic level '1', for example '00000011' or '01111111'. In the case of the thermometric code, the number of '1' logic levels is a direct indicator of the aforementioned ratio, which is capable of varying over time (due notably to dynamic variations in the supply voltage and/or the temperature).

The signature SIG at the output of the device 1200 is directed to the input of a processing module 1210, configured to compare the value of the signal SIG with a reference signature $SIG_{REF}$. The reference signature $SIG_{REF}$ is also a thermometric value, having the same number of bits as the signature SIG. Recorded in a memory 1220, the reference $SIG_{REF}$ represents the thermometric code value that must not be exceeded or reached (by lower or higher values) according to the convention chosen, to ensure that the circuit is in an authorised operating zone.

The result of the comparison between the values SIG and $SIG_{REF}$ takes the form of a command signal CMD, destined for the means for setting 1230 operating parameters of the circuit. These operating parameters which can be set include the frequency F of the clock signal CLK and at least one other parameter chosen from among, in a non-limiting manner, the supply voltage V, the bias voltage $V_{bias}$ of the digital circuit 300 and the temperature. When the signal SIG exceeds or reaches (by lower values or higher values) the reference signature $SIG_{REF}$, this means that the critical ratio has changed, either because the frequency has changed, or because another parameter such as the supply voltage has changed bringing about an increase in the propagation delay in the critical path replica.

By analogy, this also means that the propagation delay in the critical path has increased up to a value which can induce a time violation. At least one operating parameter is then commanded (via the signal CMD) to prevent such a time violation. For example, the frequency of the clock signal CLK is reduced and/or the supply voltage V is increased (which has in general the effect of reducing the propagation time).

Figure 13A:
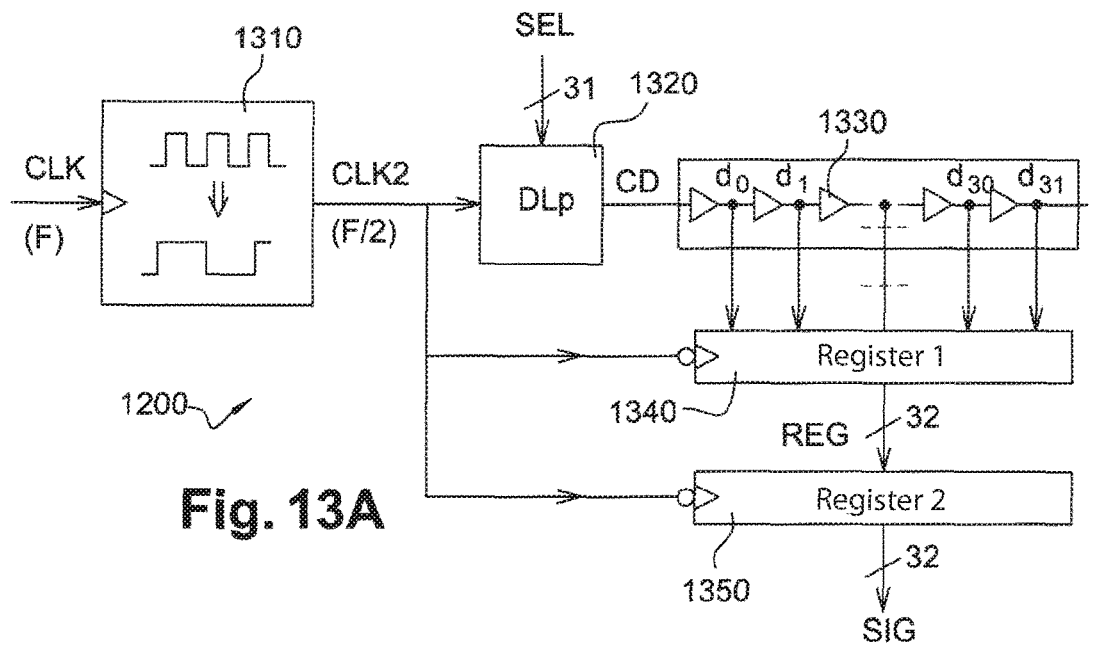
FIG. 13B represents signals of this device.

FIG. 13A schematically represents an embodiment of the monitoring device 1200, wherein the signal travelling the critical path replica is a second clock signal CLK2 having a frequency reduced by half (F/2) compared to the frequency F of the signal CLK. To produce this signal CLK2, the monitoring device 1200 comprises a clock splitter 1310 receiving as input the clock signal CLK.

The critical path replica comprises a chain of delay cells advantageously comprising a programmable delay cell 1320 followed by a chain of delay cells 1330. This programmable delay cell 1320 receives as input the signal CLK2 and produces as output a signal CD. The cell 1320 introduces into the signal CLK2 that passes through it a delay $DL_P$, of which the value may be set through the intermediary of a selection signal SEL. This makes it possible to adapt, for each core of the digital circuit, the value of the propagation delay in the replica to that of the propagation delay in the critical path. The value of the delay $DL_P$ is chosen in this example close to, but slightly less than, the value of the propagation delay in the critical path. The delay introduced by each of the delay cells 1330 is provided as small as possible to maximise the precision of the device. The sum of the delay $DL_P$ and the small delays of the cells 1330 is greater than the maximum possible value of the critical path (in the most unfavourable environmental conditions).

The signal CD is directed to the input of a chain of delay cells 1330, for example 32 in number. The delay cells 1330 are, for example, non-inverter "buffer" cells connected together in series. They constitute a line of delays, preferably all identical, sampled by a first register 1340. More precisely, each of the signals $d_0$ to $d_{31}$ at the output of the buffers 1330 is recorded, at a given instant, by a flip-flop of the register 1340 (the register thus comprises, in the example above, 32 flip-flops for 32 bits). The cells 1320, 1330 and the register 1340 form together the digital time converter part of the device 1200. In the example described, the sampling of the signals $d_0$ to $d_{31}$, by recording in the register 1340, is carried out on the falling edges of the clock signal CLK2.

The monitoring device 1200 advantageously comprises a second register 1350, which makes it possible to stabilise the data recorded by the first register 1340 (the latter being able to be metastable). The signal at the output of the second register 1350 then constitutes the thermometric signature SIG. The registers 1340 and 1350 are, in this preferential embodiment, time set by the clock signal CLK2.

Figure 13B:
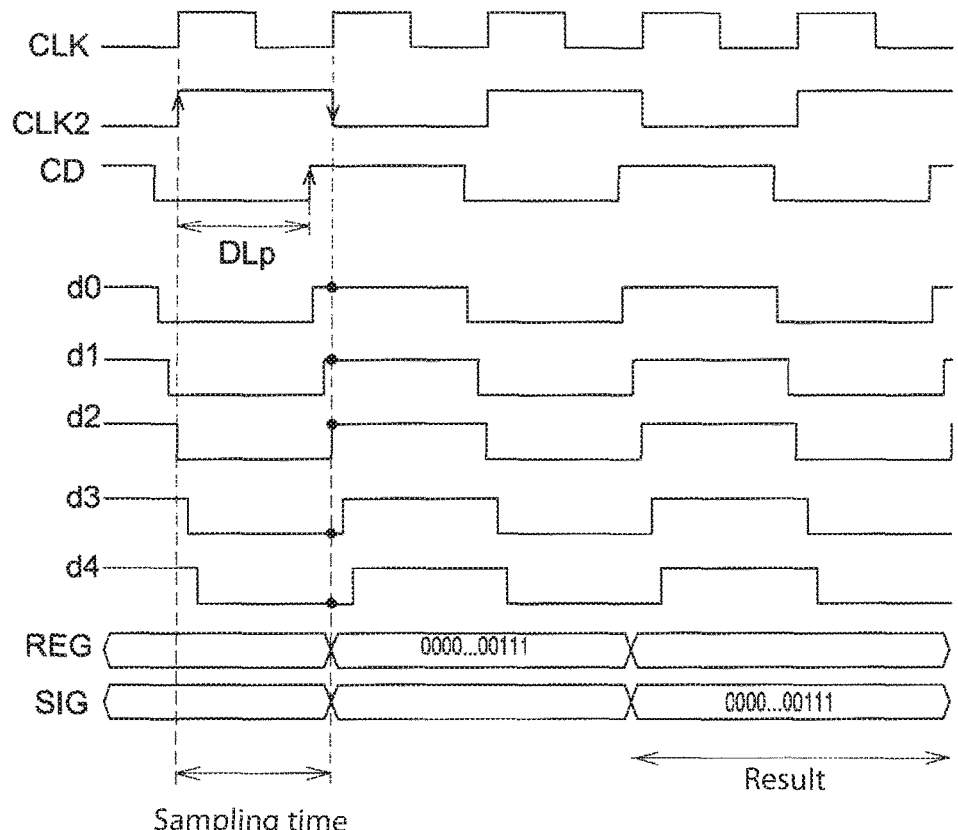

FIG. 13B represents in the form of chronograms the signals of the device of FIG. 13A. "CLK" and "CLK2" designate the clock signals, respectively at the input and output of the clock splitter 1310. "CD" corresponds to the signal at the output of the cell with programmable delay 1320. For reasons of clarity, only five of the signals at the output of the cells 1330 are represented in FIG. 13B. They involve the signals $d_0$ to $d_4$ corresponding to the five first cells 1330 of the chain. Finally, "REG" and "SIG" are the digital values stored respectively in the registers 1340 and 1350, at each active edge of the clock signal CLK2 (the falling edge in the example of the chronograms of FIG. 13B).

As indicated previously, the signal CLK2 has a frequency equal to the frequency F of the clock signal CLK divided by two. The signal CD at the output of the cell 1320 corresponds to the signal CLK2 present at its input, time shifted by a duration equal to the delay $DL_P$. Each of the following signals $d_0$ to $d_4$ is a reproduction of the signal CD a little more shifted with respect to the signal CD.

The values of the signals $d_0$ to $d_{31}$ at the falling edge of the clock signal CLK2 are recorded in the register 1340. In the example of FIG. 13B, only the first three signals $d_0$ to $d_2$ have a value equal to '1', whereas all the following signals ($d_3$ to $d_{31}$) are '0'. The register 1340 thus contains a value REG formed of three '1' bits and the remainder of the '0' bit. This same value is found again, a clock cycle CLK2 later, in the register 1350 and forms the signature SIG of the on-line monitoring device 1200.

The delay $DL_P$ is a substantial delay, called "coarse delay", compared to the "fine" delays introduced by the buffers 1330. The delay $DL_P$ corresponds, for example, to 80%-90% of the propagation delay in the critical path, whereas the delays of the buffers 1330 serve to sample, as finely as possible, the rising edge of the clock signal CLK2 which is propagated through the cell 1320. Thus, the sum of the delay $DL_P$ and a part of the delays of the buffers 1330 corresponds to the propagation delay in the critical path.

The fact of using a clock CLK2 having a lower frequency than the clock CLK and of sampling the signals $d_0$ to $d_n$ on an edge of this clock CLK2 guarantees that the value REG (and consequently the signature SIG) is in thermometric form. In fact, if the original clock signal CLK was used, both for travelling the replica 1320 and for clocking the registers 1340-1350, the final bit $d_{31}$ would risk being of the same value as the bit $d_0$ (for example "100 . . . 00111"). This would mean that the total of the delays 1330 (which separates $d_0$ and $d_{31}$) is greater than or equal to the clock period of the signal CLK.

Other embodiments of the monitoring device 1200 may be envisaged. Generally speaking, the monitoring device uses the clock signal CLK which sets the operating time of the circuit that it is wished to monitor by means of the monitoring device. The monitoring device 1200 comprises a chain of delay cells including a main delay cell and a series of fine delay cells, as has been described previously. It will be noted that the fine delay cells are not necessarily all identical, but that this can simplify the production thereof. Moreover, the clock signal sent to the input of the chain of delay cells may be the main clock signal CLK or a clock signal derived from CLK having preferably a shorter period to facilitate the realisation of the monitoring device.

The outputs of the delay cells (of all or part thereof) are connected to a register which makes it possible to memorise the values present at the output of the delay cells on an active edge for sampling a clock signal setting the time of the register. The sampling clock signal is derived from the clock signal CLK. The sampling clock signal could be equal to the signal CLK in the case for example where the clock signal sent to the input of the chain of delay cells is also the signal CLK. Generally speaking, the time T1 separating the instant of injection of an active edge at the input of the chain of cells and the instant of application of a sampling active edge on the register is equal to k*T, where k is a coefficient of proportionality and T the period of the clock signal CLK (T1=k*T). In order to be able to follow correctly the evolution of the difference or the ratio between the period T of the clock signal and the delay traversing the critical path of the circuit, it is necessary to ensure that the propagation time $T_p$ through the chain of delay cells, between its input and an intermediate point of the series of fine delay cells is also linked to the propagation time $T_{cri}$ through the critical path, according to the formula $T_p = k*T_{cri}$.

The behaviour of the device 1200 during a dynamic variation in an operating parameter will now be described, with the aid of the chronograms of FIG. 13B. Let us consider firstly that these chronograms represent an initial operating point of the circuit (corresponding to present values of operating parameters), close to an optimum operating point of the circuit. To this initial operating point, the monitoring device 1200 delivers a signature SIG equal to '00 . . . 00111', i.e. three '1' bits.

If a drop in the supply voltage occurs (at constant frequency), for example because the circuit is more loaded and causes a draw of current, the propagation delay of the rising edge of the clock signal CLK2 in the cells 1320 and 1330 increases. The number of '1' bits of the signature SIG reduces, because the signals $d_0$ to $d_{31}$ are more shifted (to the right in FIG. 13) with respect to the falling edge of the signal CLK2, which serves as reference for the sampling.

In a similar manner, if the frequency F of the clock signal CLK/CLK2 increases (i.e. the clock period T reduces), the number of '1' bits is reduced. This is due to the fact that the sampling of the register 1340 occurs more rapidly with respect to the propagation delay of the clock signal CLK2 (which it is assumed is unchanged). A spontaneous variation in the clock frequency may notably occur if the frequency (or phase) locking loop generating the clock signal is not stable.

Conversely, if the supply voltage increases (the propagation delay shortens) or if the clock frequency reduces, the number of '1' bits in the signature SIG is increased.

On rare occasions, it may happen that the supply voltage and the operating frequency vary simultaneously. Two situations then arise:
  if the clock frequency and the supply voltage change in opposite senses, the value of the signature SIG is modified (for example, the number of '1' reduces when the frequency increases and the voltage reduces),
  if the clock frequency and the supply voltage change in the same sense, it may be that one of these variations compensates the effects of the other and that the signature SIG is constant (for example, the increase in the propagation delay caused by the reduction in the voltage is compensated by a reduction in the frequency).

Thus, the signature SIG supplied by the device 1200 gives information on the evolution of the operating parameters, in other words the evolution of the operating point of the circuit. A reduction in the number of '1' bits in the signature SIG indicates, in accordance with the examples above, an approach towards a zone of non-operation (or, at the least, a dangerous zone). A counter measure, to bring the circuit back into a correct operating zone, is then adopted, as described above in relation with FIG. 12 (i.e. enslavement of the setting means 1230 as a function of the difference with the reference $SIG_{REF}$). Conversely, an increase in the number of '1' is synonymous with an increase in the safety margin. The circuit operates in a sub-optimum manner and becomes less efficient energetically. Once again, the counter measure consists in bringing the circuit back into an operating point the closest possible to an optimum operating point.

The behaviour of the device 1200 reflects not only the "sense" in which the operation of the circuit changes, but also the magnitude of the change. In fact, the number of '1' more or less in the signature SIG quantifies the amplitude of the frequency or voltage variation (for example). Counter measures to compensate these dynamic variations in parameters can then be adapted as a consequence (via the signal CMD).

Figure 14:
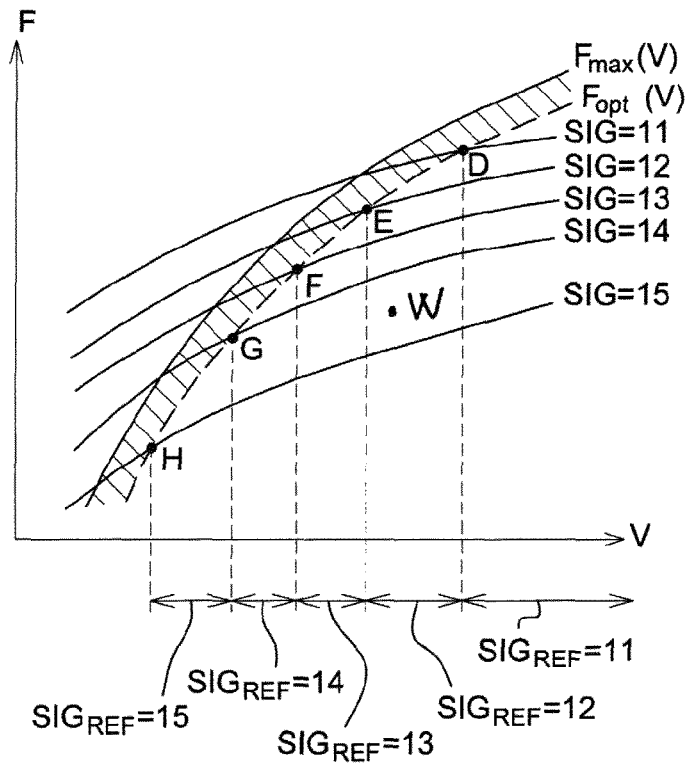
FIG. 14 represents optimum operating points of the digital circuit, at a given instant of the lifetime of the circuit, and the associated reference values of a signal at the output of the device of FIG. 13A.

FIG. 14 represents, on a graph of the clock frequency F as a function of the supply voltage V, the signature SIG values delivered by the on-line monitoring device 1200. For reasons of simplification, only the operating points of the circuit for which the signature SIG changes are represented. More precisely, the operating points situated between the curve SIG=15 and the curve SIG=14 lead to a delivered signature value equal to 15. Starting from an operating point between these two curves, the increase in the frequency or the reduction in the voltage is going to lead to a modification of the delivered signature for an operating point situated on the curve SIG=14. Several curves corresponding to several changes in signature values (i.e. from 11 to 15) are represented. The signature SIG values are here simplified and indicate the number of '1' bits. For example, "SIG=13" means that there are 13 bits of '1' value.

A curve characteristic $F_{max}(V)$ of the operation of the circuit, obtained for example according to the characterization method described previously, is superimposed on the signature SIG curves of device 1200. To this curve of the maximum frequency $F_{max}(V)$ may be added a safety margin called "dynamic", symbolised by a hatched area in FIG. 14, to obtain a curve $F_{opt}(V)$ of the optimum frequency as a function of the supply voltage.

The dynamic safety margin is equal, as an example, to 40 mV (each point of the curve $F_{max}(V)$ is then translated horizontally to the right by 40 mV). This makes it possible notably to compensate electrical noise in the circuit and to "cushion" drops in the supply voltage V, thus avoiding the circuit entering into a state of malfunction (above the curve $F_{max}(V)$).

The dynamic safety margin may be combined with the static safety margin described in relation with FIG. 11. Thus, the added safety margin may have two components, one static to take account of variations in the manufacturing method and the other dynamic to take account of environmental variations (temperature gradients, voltage drop, etc.).

As a reminder, the safety margins, respectively static and dynamic, aim to guarantee the operation of the circuit to respectively compensate the (potential) error committed on the determination of the maximum frequency $F_{max}$ and to cushion environmental variations. They are deducted from the curve $F_{max}(V)$ and consequently have a tendency to move the operating point of the circuit away from the curve $F_{max}(V)$. On the contrary, the correction margin $\Delta F_i$ aims to come closer to the operating limit $F_{max}(V)$, starting from the operating points $F_d(V)$ detected by the sensors (cf. FIG. 7).

On the curve $F_{opt}(V)$ of FIG. 14 is represented the optimum operating points D to H of the circuit corresponding to the intersection of the curves SIG=11 to SIG=15 with the curve $F_{opt}(V)$.

In FIG. 14, it may be noted that the signature SIG value associated with an optimum operating point varies according to the position of the point on the curve $F_{opt}(V)$. On the basis of this finding, it is provided to define a reference signature $SIG_{REF}$ value for each segment of the curve $F_{opt}(V)$ between two successive points D to H or above the extreme points. This reference signature will then serve as alert signature in order to ensure that the operating point of the circuit (F,V) always remains in an authorised zone (to avoid faults), the authorised zone being in this example the operating points situated on the right of the curve $F_{max}(V)$, and preferably on the right of the curve $F_{opt}(V)$ to take a margin.

As an example, if the present operating point is the point W represented in FIG. 14, with a current signature equal to SIG=15 (the point W being between SIG=15 and SIG=14, in the range of voltages defined by the voltage values of the points E and D), it would be possible without problem to increase the frequency up to reaching the curve SIG 12 or it would be possible to reduce the voltage up to reaching the curve SIG 14. Above these respective curves, the circuit is capable of exhibiting errors.

It is thus provided to associate a reference signature with each segment of the curve $F_{opt}(V)$. It will be noted that for a given segment, for example the segment E-D, a signature SIG value equal to 12 or 13 could be memorised, depending on whether it is wished to memorise the value not to reach or the value not to exceed.

Moreover, it will be noted that the monitoring device is preferably chosen such that the curves SIG exhibit, at least for a given range of voltage values, a monotony similar to that of the functions $F_{max}(V)$ and $F_{opt}(V)$. In this case, knowledge of the present operating point makes it possible to determine near to which segment of the curve $F_{opt}(V)$ is situated the present operating point and that it is thus possible to avoid the operating point overstepping the curve $F_{opt}(V)$ while monitoring the signature delivered by the monitoring device and by ensuring that it does not exceed the signature value associated with the segment considered.

A simple way of putting into practice this monitoring is to define ranges of values of the supply voltage V corresponding to segments and to attribute, to each range of voltages, a value of the reference signature $SIG_{REF}$. The value $SIG_{REF}$ assigned to each range corresponds to the signature SIG curve, which is the closest to the curve $F_{opt}(V)$ on the segment considered, without however exceeding the range of voltages considered. Choosing a further away signature curve would come down to considering a greater safety margin, and thus to constraining the circuit to a non-optimised operation.

As an illustration, above the point D on the curve $F_{opt}(V)$, the closest signature curve is that corresponding to the value SIG=11. A reference value $SIG_{REF}$ equal to 11 is then assigned to the range of voltages greater than the voltage corresponding to the point D. In the range of voltages V situated between the points D and E, the curve SIG=11 exceeds the optimum frequency $F_{opt}(V)$, it is thus necessary to choose a higher signature value, in this particular instance SIG=12.

Thus, once the reference signatures have been associated with different voltage ranges, and the set memorised in the memory MEM, it is possible that the device 1210 defines more precisely the commands CMD, knowing the present operating point of the circuit. The device thus searches in the memory 1220 the reference signature associated with the range of voltage values in which is situated the present operating point and compares this reference signature with the signature delivered by the monitoring device 1200. The command CMD is thus defined on the basis of this comparison. The further away the signature delivered by the monitoring device is from the reference signature considered for the current range of voltages, the more it will be possible to vary the operating parameters to come closer to the curve $F_{opt}(V)$ if it is wished to move away from it as little as possible for energy reasons. Other command strategies may also be implemented by the device 1230 as a function of the result of the comparison between the current signature delivered by the monitoring device 1200 and the reference signature considered.

The same thing is thus done for each range of supply voltages V associated with a segment. Between the points E and F, the lowest acceptable signature value is SIG=13, hence $SIG_{REF}=13$. Between the points F and G, the signature value is $SIG_{REF}=14$. Finally, between the points G and H, the signature value is $SIG_{REF}=15$. The different reference signatures $SIG_{REF}$ are recorded in the memory 1220 of the circuit 300 (FIG. 12).

In practice, the determination of the reference signature $SIG_{REF}$ values to consider according to the value of the current operating point of the circuit may be carried out by the processing module 1210 which is coupled to the on-line monitoring device 1200. The determination protocol is described hereafter.

In a first step, it is sought to obtain the different curves SIG and the curve $F_{max}(V)$. It is thus possible to carry out in an iterative manner, for several values of supply voltage applied to the circuit, the following operations:

operating the circuit at different frequency values, for example starting from a low frequency and increasing it progressively and noting the frequencies corresponding to changes of signature value, to obtain points respectively of each of the curves SIG, for the present voltage value, determining a value $F_{max}$ of the clock frequency, for example using the characterization method described above (the frequency scanning used to find the points of the curves SIG being advantageously used to determine $F_{max}$ corresponding to the present voltage according to the method described previously).

In a second step, potentially a curve $F_{opt}(V)$ is determined from $F_{max}(V)$ if it is wished to take a safety margin on one or more operating parameters, for example the voltage.

One then seeks what is, in the authorised operating zone, the curve SIG the closest to a segment of the curve $F_{opt}(V)$ if a margin has been taken, or the curve $F_{max}$ if no margin has been taken. If it is not still the same curve SIG which is the closest to the curve $F_{opt}(V)$ or $F_{max}(V)$, the curves SIG which are respectively the closest are defined for several segments of the curve.

For each curve segment retained, a zone of operating points is defined including the segment for which it is going to be considered that the reference signature not to exceed or reach is that of the curve SIG the closest to the segment. In the example described previously, a zone is defined by a range of voltage values; nevertheless, it may be envisaged to define each zone by means of several operating parameters.

Then the value $SIG_{REF}$ and the definition of the associated zone of operating points are recorded in the memory 1220 coupled to the processing module 1210.

Preferably, during the application of the aforementioned protocol, the whole of the circuit 300 is active, for example by applying appropriate test patterns to implement the method for determining the function $F_{max}$, in order that the monitoring device 1200 is in environmental conditions (temperature notably) close to those of the circuit 300 when it is active.

The safety margin could be expressed in frequency, for example 50 MHz, rather than in voltage, to take account of fluctuations in the clock signal ("jitter"). The curve $F_{opt}(V)$ would then be obtained by translating the curve $F_{max}(V)$ "downwards" by deducting the safety margin from the maximum clock frequency $F_{max}(V)$, for a given voltage. The safety margin may also result from a combination of a voltage margin and a frequency margin. In this latter case, the curve $F_{opt}(V)$ would be obtained by performing two translations (on the left and downwards).

After the reference values $SIG_{REF}$ have been recorded, the on-line monitoring device 1200 and the processing module 1210 may be used as has been described in relation with FIG. 12, to detect a coming closer, or even an overrun, of the present operating point of the circuit of the curve $F_{opt}(V)$ (or potentially the curve $F_{max}$ if no margin is taken). This information of coming closer or even exceeding may advantageously be used to ensure the correct operation of the circuit by maintaining the present operating point in the authorised zone by commanding the actuating device 1230. This information can also be used to maintain the operating point of the circuit the nearest possible to the curve $F_{opt}(V)$ to optimise the energy consumption of the circuit while ensuring correct operation, notably in periods of change of the operating point.

Thanks to the fact that it is henceforth possible to determine rapidly and simply the optimum operating points of the digital circuit situated on the curve $F_{opt}(V)$ (or $F_{max}$ if no margin is taken), using the characterization method according to the invention, the reference signature $SIG_{REF}$ values and the associated zones of operating points may be updated on several occasions during the lifetime of the circuit.

Figure 15:
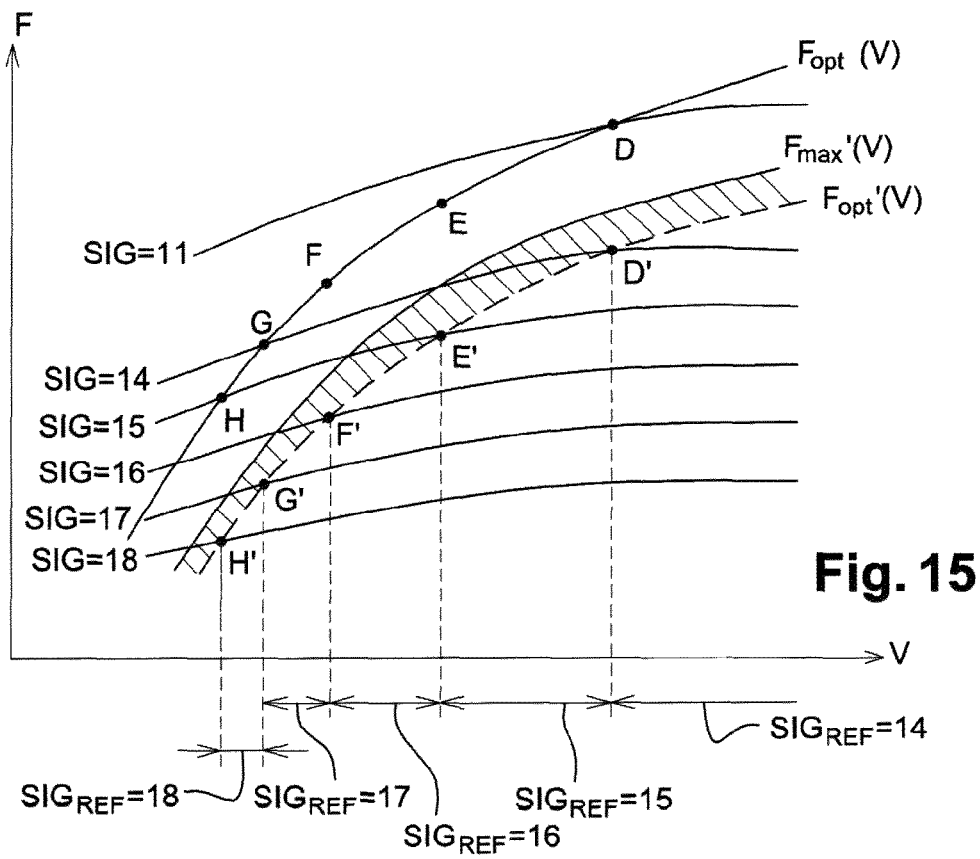
FIG. 15 represents optimum operating points of the digital circuit, at another instant of the lifetime of the circuit, and the new associated reference values of the signal at the output of the device of FIG. 13A.

As an example, in FIG. 15, a new characterization of the digital circuit has made it possible to establish the maximum frequency curve $F_{max}'(V)$, at another instant of the lifetime of the circuit. The curve $F_{opt}'(V)$, obtained from the curve $F_{max}'(V)$ and a safety margin, represents the optimum operating curve at this same instant.

The curve $F_{opt}(V)$ of FIG. 14 is also represented in FIG. 15, by way of comparison. The difference between the curves $F_{opt}'(V)$ and $F_{opt}(V)$ is explained, for example, by the ageing of the circuit or by new environmental conditions, inducing in this example a reduction in the time performances over time ($F_{max}'(V) < F_{max}(V)$).

The curve $F_{opt}'(V)$ is distinct from the preceding characteristic $F_{opt}(V)$. It intersects other signature curves SIG, for example curves of value comprised between 14 and 18. The new intersection points are noted D' to H' in FIG. 15. Consequently, other reference values $SIG_{REF}$ may be associated with new segments linking these new intersection points. The segments are for example associated with ranges of values of the supply voltage V and a reference value $SIG_{REF}$ is measured per range, as described above in relation with FIG. 14.

FIG. 15 represents an evolution of the possible optimum operation over time. The period of time spent between two successive characterizations (D and D') is, for example, of the order of several days, i.e. a duration much longer than the calculation time necessary to implement the method for characterizing the frequency $F_{max}$, and the corresponding updating of the values memorised in the memory 1220.

The invention claimed is:

1. A method for calibrating a digital circuit comprising:
   a plurality of sequential elements;
   data conducting paths between the sequential elements;
   a clock tree delivering a clock signal for clocking the sequential elements; and
   a time fault sensor of preventive type coupled to one of the sequential elements, receiving as input a data signal arriving at the sequential element and configured to detect during a detection window a transition of the data signal;
   means for setting at least one first and one second operating parameter of the digital circuit;
   the calibration method comprising:
   a) activating a data conducting path up to the sequential element coupled to the sensor;
   b) determining, for a given value of the first parameter, a first value of the second parameter from which the sensor detects a transition of the data signal during the detection window, said values of the first and second parameters defining a detection operating point of the digital circuit;
   c) determining, for said value of the first parameter, a second value of the second parameter above which the digital circuit is in malfunction;
   d) calculating, for the detection operating point, a correction margin equal to the difference between the first and second values of the second parameter.

2. The method according to claim 1, wherein steps a) to d) are carried out for a plurality of control circuits having a structure identical to the digital circuit, for a same given value of the first parameter, so as to obtain several correction margins relative to the sensor, and further comprising a step of determining an optimum correction margin associated with the value of the first parameter of the detection operating points from correction margins relative to the sensor.

3. The method according to claim 2, wherein the optimum correction margin is an arithmetic mean of the correction margins relative to the sensor.

4. The method according to claim 2, wherein the optimum correction margin is the lowest of the correction margins relative to the sensor.

5. The method according to claim 1, wherein one of the first and second parameters is chosen from among a frequency and a period of the clock signal and wherein the other of the first and second parameters is chosen from among a supply voltage and a bias voltage of the digital circuit.

6. The method according to claim 5, wherein the second parameter is the frequency of the clock signal and each correction margin is a frequency margin.

7. The method according to claim 5, wherein the second parameter is the period of the clock signal and each correction margin is a time margin.

8. The method according to claim 5, wherein the second parameter is chosen from among the supply voltage and the bias voltage of the digital circuit and each correction margin is a voltage margin.

9. The method according to claim 1, wherein the second value of the second parameter is obtained by activating a critical data conducting path and by modifying progressively the second parameter up to causing a time violation of the data signal received by the sequential element arranged on the critical path, with respect to an active edge of the clock signal.

10. The method according to claim 1, wherein steps a) to d) are carried out for several values of the first parameter.

11. The method according to claim 1, wherein the detection window is located before an active edge of the clock signal.

12. The method according to claim 1, wherein the detection window is between 10% and 50% of a period of the clock signal.

13. A method for characterizing an integrated circuit consisting in determining at a given instant of the life of the circuit an optimum operating point of the digital circuit comprising:
    a plurality of sequential elements;
    data conducting paths between the sequential elements;
    a clock tree delivering a clock signal for clocking the sequential elements; and
    a time fault sensor of preventive type coupled to one of the sequential elements, receiving as input a data signal arriving at the sequential element and configured to detect, during a detection window, a transition of the data signal,
    means for setting at least one first and one second operating parameter of the digital circuit,
    the characterization method comprising:
    e) activating a data conducting path up to the sequential element coupled to the sensor,
    f) determining, for a given value of the first parameter, a first value of the second parameter from which the sensor detects a transition of the data signal during the detection window, said values of the first and second parameters defining a detection operating point of the digital circuit,
    g) determining an optimum operating point associated with the detection operating point, by adding to the first value of the second parameter, a predetermined correction margin in relation with a limit value of the second parameter which would lead to a malfunction of the digital circuit, for the given value of the first parameter, said correction margin being associated with the given value of the first parameter of the detection operating point.

14. The method according to claim 13, in which, when the circuit comprises a plurality of time fault sensors of preventive type each coupled to one of the sequential elements, steps e) to g) are carried out for each sensor, so as to obtain a plurality of corrected operating points having the same value of the first parameter, the method further comprising a step of determining, from the plurality of corrected operating points, a single optimum operating point associated with the considered value of the first parameter.

15. The method according to claim 14, wherein the single optimum operating point is defined by said value of the first parameter and an arithmetic mean of said values of the second parameter of the plurality of corrected operating points.

16. The method according to claim 14, wherein the second parameter is a frequency of the clock signal and the single optimum operating point is defined by said value of the first parameter and the lowest of said values of the second parameter of the plurality of corrected operating points.

17. The method according to claim 14, wherein the second parameter is the supply voltage (V) of the digital circuit and the single optimum operating point is defined by said value of the first parameter and the highest of said values of the second parameter of the plurality of corrected operating points.

18. The method according to claim 13, wherein the predetermined correction margin is memorised in a memory of the circuit or is calculated from a functional relation memorised in the circuit; the memorised values or the functional relation being obtained by the implementation of a calibration method.

19. The method according to claim 13, wherein steps e) to g) are carried out for several values of the first parameter.

20. A digital electronic circuit comprising:
a plurality of sequential elements;
data conducting paths between the sequential elements, at least one of the data conducting paths being critical in terms of data propagation delay,
a clock tree delivering a clock signal for clocking the sequential elements; and
a time fault sensor of preventive type coupled to one of the sequential elements, receiving as input a data signal arriving at the sequential element and configured to detect, during a detection window, a transition of the data signal,
means for setting at least one first and one second operating parameter of the digital circuit,
a controller configured to implement, during a characterization phase, the following steps:
e) activating a data conducting path up to the sequential element coupled to the sensor,
f) determining, for a given value of the first parameter, a first value of the second parameter from which the sensor detects a transition of the data signal during the detection window, said values of the first and second parameters defining a detection operating point of the digital circuit,
g) determining an optimum operating point associated with the detection operating point, by adding to the first value of the second parameter, a predetermined correction margin in relation with a limit value of the second parameter which would lead to a malfunction of the digital circuit, for the given value of the first parameter, said correction margin being associated with the given value of the first parameter of the detection operating point.

21. The digital electronic circuit according to claim 20, wherein the controller is further configured to implement, during a calibration phase, the following steps:
activating a data conducting path up to the sequential element coupled to the sensor,
determining, for a given value of the first parameter, a first value of the second parameter from which the sensor detects a transition of the data signal during the detection window, said values of the first and second parameters defining a detection operating point of the digital circuit,
determining, for said value of the first parameter, a second value of the second parameter above which the digital circuit is in malfunction;
calculating, for the detection operating point, a correction margin equal to the difference between the first and second values of the second parameter.

22. The digital electronic circuit according to claim 20, comprising:
a device for on-line monitoring the operation of the digital circuit, comprising a chain of delay cells of which the propagation delay varies in the same manner as the propagation delay through the critical path and configured to deliver a digital signature representative of a ratio between the period of said clock signal and the propagation delay through the critical path; and
a processing module configured to compare the digital signature from the monitoring device with a reference signature, the result of the comparison being used to command the means for setting the first and second operating parameters.

23. The digital electronic circuit according to claim 22, wherein said controller is further configured to determine a set of optimum operating points of the digital circuit, the set of optimum operating points constituting an optimum operating curve delimiting respectively desired and undesired operating zones, and wherein said controller is further configured to:
identify segments of the optimum operating curve for which the digital signature delivered by the on-line monitoring device has a single value;
record in a memory coupled to the processing module a zone of operating points corresponding to each identified segment and the associated reference signature, the associated reference signature being a function of the digital signature value delivered by the on-line monitoring device for the operating points of the identified segment;
selecting, in the memory, the reference signature associated with the zone of operating points including a current operating point of the digital circuit, the reference signature selected being used by the processing module to command the means for setting the operating parameters.

* * * * *